US010775696B2

(12) United States Patent
Meyers et al.

(10) Patent No.: US 10,775,696 B2
(45) Date of Patent: Sep. 15, 2020

(54) ORGANOTIN OXIDE HYDROXIDE PATTERNING COMPOSITIONS, PRECURSORS, AND PATTERNING

(71) Applicant: Inpria Corporation, Corvallis, OR (US)

(72) Inventors: Stephen T. Meyers, Corvallis, OR (US); Jeremy T. Anderson, Corvallis, OR (US); Brian J. Cardineau, Corvallis, OR (US); Joseph B. Edson, Corvallis, OR (US); Kai Jiang, Corvallis, OR (US); Douglas A. Keszler, Corvallis, OR (US); Alan J. Telecky, Albany, OR (US)

(73) Assignee: Inpria Corporation, Corvallis, OR (US)

(*) Notice: Subject to any disclaimer, the term of this patent is extended or adjusted under 35 U.S.C. 154(b) by 106 days.

(21) Appl. No.: 16/238,779

(22) Filed: Jan. 3, 2019

(65) Prior Publication Data

US 2019/0137870 A1    May 9, 2019

Related U.S. Application Data

(63) Continuation of application No. 15/291,738, filed on Oct. 12, 2016, now Pat. No. 10,228,618.

(60) Provisional application No. 62/297,540, filed on Feb. 19, 2016, provisional application No. 62/240,812, filed on Oct. 13, 2015.

(51) Int. Cl.
| | |
|---|---|
| *G03F 7/004* | (2006.01) |
| *G03F 7/16* | (2006.01) |
| *C23C 14/08* | (2006.01) |
| *C23C 16/40* | (2006.01) |
| *G03F 7/38* | (2006.01) |
| *G03F 7/20* | (2006.01) |
| *G03F 7/32* | (2006.01) |
| *G03F 7/40* | (2006.01) |

(52) U.S. Cl.
CPC .......... *G03F 7/0042* (2013.01); *C23C 14/086* (2013.01); *C23C 16/407* (2013.01); *G03F 7/0043* (2013.01); *G03F 7/162* (2013.01); *G03F 7/167* (2013.01); *G03F 7/168* (2013.01); *G03F 7/2004* (2013.01); *G03F 7/325* (2013.01); *G03F 7/38* (2013.01); *G03F 7/40* (2013.01)

(58) Field of Classification Search
CPC . G03F 7/167; G03F 7/168; G03F 7/38; G03F 7/0042; C23C 14/086; C23C 16/407
See application file for complete search history.

(56) References Cited

U.S. PATENT DOCUMENTS

| | | |
|---|---|---|
| 3,385,915 A | 5/1968 | Hamling |
| 3,635,883 A | 1/1972 | Stamm |
| 4,102,683 A | 7/1978 | DiPiazza |
| 4,104,292 A | 8/1978 | Dworkin et al. |
| 4,370,405 A | 1/1983 | O'Toole et al. |
| 4,380,559 A | 4/1983 | Mandai et al. |
| 4,601,917 A | 7/1986 | Russo et al. |
| 4,639,208 A | 1/1987 | Inui et al. |
| 4,710,122 A | 12/1987 | Villanueva |
| 4,732,841 A | 3/1988 | Radigan |
| 4,851,481 A | 1/1989 | Kuriyama et al. |
| 4,891,303 A | 1/1990 | Garza et al. |
| 5,025,094 A | 6/1991 | King |
| 5,672,243 A | 9/1997 | Hsia et al. |
| 5,891,985 A | 4/1999 | Brugel |
| 6,020,269 A | 2/2000 | Wang et al. |
| 6,060,380 A | 5/2000 | Subramanian et al. |
| 6,179,922 B1 | 1/2001 | Ishikawa et al. |
| 6,183,716 B1 | 2/2001 | Sleight et al. |
| 6,194,323 B1 | 2/2001 | Downey et al. |
| 6,197,896 B1 | 3/2001 | Aviram et al. |
| 6,268,457 B1 | 7/2001 | Kennedy et al. |
| 6,287,951 B1 | 9/2001 | Lucas et al. |
| 6,420,088 B1 | 7/2002 | Angelopoulos et al. |
| 6,566,276 B2 | 5/2003 | Maloney et al. |

(Continued)

FOREIGN PATENT DOCUMENTS

| | | |
|---|---|---|
| EP | 1067595 A2 | 1/2001 |
| GB | 2466486 | 6/2010 |

(Continued)

OTHER PUBLICATIONS

Office Action from co-pending Japanese Application No. 2018-518688 dated Apr. 21, 2020.
Ahmed et al., "Synthesis and Characterization of Zirconium and Hafnium Sulfates, Hydroxide Sulfates and Oxide Sulfates", Acta Chemica Scandinavica, 53:24-33 (1999).
Atagi et al., "Homoleptic Tin and Silicon Amido Compounds as Precursors for Low-Temperature Atmospheric Pressure Chemical Vapor Deposition of Tin and Silicon Oxide Thin Films", Chemical Material 6, 360-361 (1994).

(Continued)

*Primary Examiner* — John S Chu
(74) *Attorney, Agent, or Firm* — Christensen, Fonder, Dardi; Peter S. Dardi; Diane E. Bennett

(57) ABSTRACT

Organometallic precursors are described for the formation of high resolution lithography patterning coatings based on metal oxide hydroxide chemistry. The precursor compositions generally comprise ligands readily hydrolysable by water vapor or other OH source composition under modest conditions. The organometallic precursors generally comprise a radiation sensitive organo ligand to tin that can result in a coating that can be effective for high resolution patterning at relatively low radiation doses and is particularly useful for EUV patterning. The precursors compositions are readily processable under commercially suitable conditions. Solution phase processing with in situ hydrolysis or vapor based deposition can be used to form the coatings.

10 Claims, 7 Drawing Sheets

(56) References Cited

U.S. PATENT DOCUMENTS

| | | |
|---|---|---|
| 6,583,071 B1 | 6/2003 | Weidman et al. |
| 6,730,454 B2 | 5/2004 | Pfeiffer et al. |
| 6,844,604 B2 | 1/2005 | Lee et al. |
| 6,927,108 B2 | 8/2005 | Weng et al. |
| 6,946,677 B2 | 9/2005 | Ostegard |
| 7,001,821 B2 | 2/2006 | Aggarwal et al. |
| 7,208,341 B2 | 4/2007 | Lee et al. |
| 7,256,129 B2 | 8/2007 | Nam et al. |
| 7,709,056 B2 | 5/2010 | Elam et al. |
| 7,773,365 B2 | 8/2010 | Herman et al. |
| 7,799,503 B2 | 9/2010 | Brodsky et al. |
| 8,030,507 B2 | 10/2011 | Kim et al. |
| 8,053,370 B2 | 11/2011 | Yang et al. |
| 8,092,703 B2 | 1/2012 | Ishibashi et al. |
| 8,366,967 B2 | 2/2013 | Keszler et al. |
| 8,415,000 B2 | 4/2013 | Stowers et al. |
| 8,796,483 B2 | 8/2014 | Gordon et al. |
| 9,310,684 B2 | 4/2016 | Meyers et al. |
| 10,025,179 B2 | 7/2018 | Meyers et al. |
| 10,228,618 B2 * | 3/2019 | Meyers .................. G03F 7/0042 |
| 10,642,153 B2 * | 5/2020 | Meyers .................. G03F 7/325 |
| 2002/0076495 A1 | 6/2002 | Maloney et al. |
| 2003/0124457 A1 | 7/2003 | Jung et al. |
| 2004/0067444 A1 | 4/2004 | Wakabayashi et al. |
| 2006/0088962 A1 | 4/2006 | Herman et al. |
| 2006/0234138 A1 | 10/2006 | Fehlhaber et al. |
| 2008/0055597 A1 | 3/2008 | Sun et al. |
| 2008/0286683 A1 | 11/2008 | Brodsky et al. |
| 2009/0155546 A1 | 6/2009 | Yamashita et al. |
| 2009/0174036 A1 | 7/2009 | Fuller et al. |
| 2010/0044698 A1 | 2/2010 | Herman et al. |
| 2010/0184259 A1 | 7/2010 | Radigan et al. |
| 2011/0045406 A1 | 2/2011 | Kezsler et al. |
| 2011/0135823 A1 | 6/2011 | Lee et al. |
| 2011/0166268 A1 | 7/2011 | Deelman et al. |
| 2011/0206599 A1 | 8/2011 | Keszler et al. |
| 2011/0244403 A1 | 10/2011 | Carcasi et al. |
| 2011/0293888 A1 | 12/2011 | Stowers et al. |
| 2012/0223418 A1 | 9/2012 | Stowers et al. |
| 2013/0224652 A1 | 8/2013 | Bass et al. |
| 2013/0253161 A1 | 9/2013 | Amako et al. |
| 2014/0268062 A1 | 9/2014 | Melnik |
| 2014/0303283 A1 | 10/2014 | Ding et al. |
| 2015/0056542 A1 | 2/2015 | Meyers et al. |
| 2015/0079393 A1 | 3/2015 | Freedman et al. |
| 2015/0221519 A1 | 8/2015 | Marks et al. |
| 2015/0253667 A1 | 9/2015 | Bristol et al. |
| 2016/0116839 A1 | 4/2016 | Meyers |
| 2017/0184960 A1 | 6/2017 | Naruoka et al. |
| 2017/0184961 A1 | 6/2017 | Nakagawa et al. |
| 2019/0137870 A1 * | 5/2019 | Meyers .................. G03F 7/168 |

FOREIGN PATENT DOCUMENTS

| | | |
|---|---|---|
| JP | 57-123126 | 7/1982 |
| JP | S63-241061 A | 10/1988 |
| JP | H03-148659 A | 6/1991 |
| JP | 2001-81560 A | 3/2001 |
| JP | 2006-284947 A | 10/2006 |
| JP | 2008-091215 A | 4/2008 |
| JP | 2010-094583 A | 4/2010 |
| JP | 2016-530565 A | 9/2016 |
| JP | 2018-502173 A | 1/2018 |
| JP | 2018-017780 A | 2/2018 |
| WO | 1998-015559 A1 | 4/1998 |
| WO | 2005-043246 | 5/2005 |
| WO | 2008-082448 | 7/2008 |
| WO | 2009-120169 | 10/2009 |
| WO | 2014-150411 A1 | 9/2014 |
| WO | 2015-064602 A1 | 5/2015 |
| WO | 2016-065120 A1 | 4/2016 |
| WO | 2016-043198 A1 | 7/2017 |
| WO | 2016-043200 A1 | 7/2017 |
| WO | 2018-123388 A1 | 7/2018 |
| WO | 2018-123537 A1 | 7/2018 |
| WO | 2018-139109 A1 | 8/2018 |
| WO | 2018-168221 A1 | 9/2018 |

OTHER PUBLICATIONS

Chandrasekhar et al., "Organotin Assemblies Containing Sn—O Bonds", Coordination Chemistry Reviews, 235:1-52 (2002).

Eychenne-Baron et al., "New Synthesis of the Nanobuilding Block {(BuSn)12O14(OH6)}2+ and Exchange Properties of {(BuSn)12O14(OH)6}(O3SC6H4CH3)2", Journal of Organometallic Chemistry, 567:137-142 (1998).

Eychenne-Baron et al., "Reaction of Butyltin Hydroxide Oxide With p-Toluenesulfonic Acid: Synthesis, X-Ray Crystal Analysis, and Multinuclear NMR Characterization of {(BuSn)12O14(OH)6}(4-CH3C6H4SO3)2", Organometallics, 19:1940-1949 (2000).

Hampden-Smith et al., "Solid State and Solution Structural Investigation of Homoleptic Tin (IV) Alkoxide Compounds. Part I. Sn (O-t-Bu)4 and [Sn(O-i-Pr)4 HO-i-Pr]2", Canadian Journal of Chemistry, 69:121 (1991).

Hänssgen et al., "Synthesis of the First Momo-t-butyltin Element Connections", Organometallic Chemistry, 293:191-195 (1985). (English Abstract Only).

International Standard ISO 21348 "Space Environment (Natural and Artificial)—Process for Determining Solar Irradiances", First Edition 2007, Reference number: ISO 21348:2007€, (20 pages).

Jaumier et al., "Transmetalation of Tetraalkynyltin Compounds With Grignard Reagents: Access to Mono-and Dialkyltin Products", Angewandte Chemie International Edition, 38(3):402-404 (Feb. 1, 1999).

Jaumier et al., "New Route to Monoorganotin Oxides and Alkoxides From Trialkynylorganotins", Chemical Communications, (3):369-370 (1998).

Jones et al., "Amino-Derivatives of Metals and Metalloids. Part I. Preparation of Aminostannenes, Stannylamines and Stannazanes", Journal of the Chemical Society, 1944-1951 (1965).

Leskelä et al, "ALD Precursor Chemistry: Evolution and Future Challenges", Journal Physics IV, 9, 837-849 (1999).

Leskelä et al, "Atomic Layer Deposition (ALD): From Precursors to Thin Film Structures", Thin Solid Films 409, 138-146 (2002).

Levashov et al, "Lewis Acid Promoted Direct Synthesis of Tetraalkynylstannanes", Tetrahedron Letters, 56 (14):1870-1872 (2015).

Maeng et al., "Atomic Layer Deposition of Ta-Based Thin Films: Reactions of Alkylamide Precursor With Various Reactants", Journal of Vacuum Science & Technology B, 24(5) 2276-2281 (2006).

Meyers et al., "Solution-Processed Aluminum Oxide Phosphate Thin-Film Dielectrics", Chem. Mater., 19 (16):4023-4029 (2007). (Absract Only).

Nakata et al., "Improvement of InGaZnO4 Thin Film Transistors Characteristics Utilizing Excimer Laser Annealing", The Japan Society of Applied Physics, (2009). (Abstract Only).

Neef et al., "Effects of Carbon/Hardmask Interactions on Hardmask Performance", Proc. of SPIE, 7273, 727311-1-727311-7 (2009).

Owen et al., "1/8 µm Optical Lithography", J. Vac. Sci. Technol. B 10, 3032 (1992). (Abstract Only).

Puff et al., "Zur Hydrolyse von Monoorganylzinn-trihalogeniden", Journal of Organometallic Chemistry, 368:173-183 (1989). (Absract Only).

Rodríguez-Reyes et al., "Mechanisms of Adsorption and Decomposition of Metal Alkylamide Precursors for Ultrathin Film Growth", Journal of Applied Physics 104, 084907, 1-7 (2008).

Stowers, "Direct Patterning of Solution Deposited Metal Oxides", A Dissertation to Oregon State University, 149 pages (Aug. 14, 2008).

Stowers et al., "High Resolution, High Sensitivity Inorganic Resists", Microelectronic Engineering, 86:730-733 (2009).

Stowers et al., "Directly Patterned Inorganic Hardmask for EUV Lithography", Proc. SPIE 7969, 796915, http://dx.doi.org/10.1117/12.879542 (2011).

Wang et al.,"TiO2 Micro-Devices Fabricated by Laser Direct Writing", Optics Express, 19(18):17390-17395 (Aug. 29, 2011).

Zhang et al., "Stabilization of Cubic ZrO2 with Rh(III) and/or La(III)", Journal of Solid State Chemistry, 72:131-136 (1988).

(56) References Cited

OTHER PUBLICATIONS

Zimmerman, "Extension Options for 193nm Immersion Lithography", Journal of Photopolymer Science and Technology, 22(5) 2 pages (2009). (Abstract Only).

International Search Report and Written Opinion From Application No. PCT/US15/56865 dated Feb. 5, 2016 (12 pages).

International Search Report and Written Opinion from related Application No. PCT/US2016/056637 dated May 30, 2017 (19 pages).

Supplementary European Search Report from related Application No. 16856109.0 for PCT/US2016/056637 dated Sep. 4, 2019.

Office Action from Co-pending Taiwan Application No. 105133028 dated Sep. 3, 2019.

\* cited by examiner

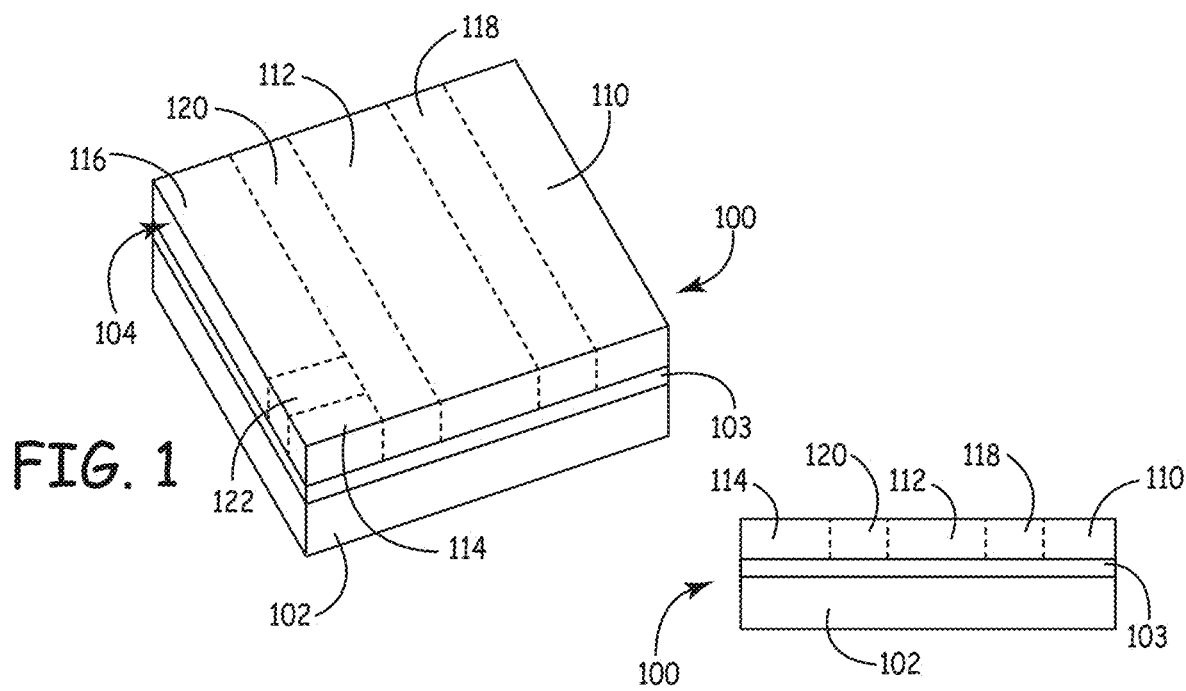
FIG. 1
FIG. 2
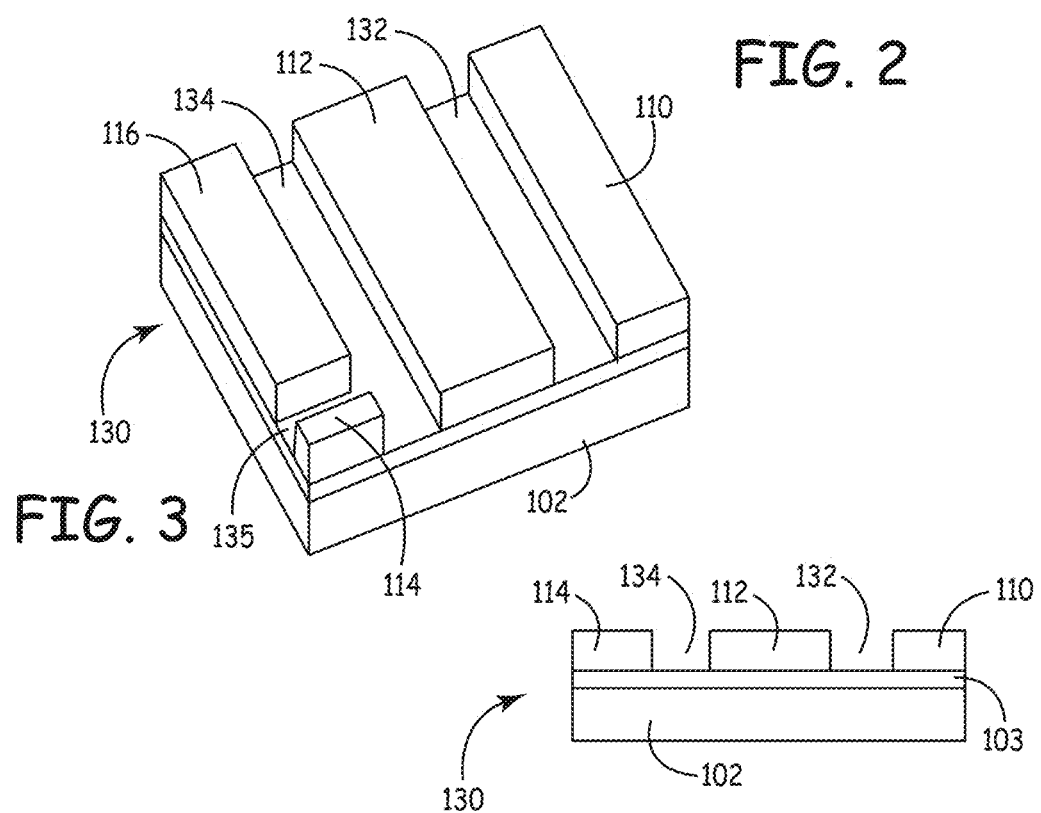
FIG. 3
FIG. 4

ORGANOTIN OXIDE HYDROXIDE PATTERNING COMPOSITIONS, PRECURSORS, AND PATTERNING

CROSS REFERENCE TO RELATED APPLICATIONS

This application claims priority to copending U.S. patent application Ser. No. 15/291,738, filed Oct. 12, 2016, to Meyers et al., entitled "Organotin Oxide Hydroxide Patterning Compositions, Precursors, and Patterning," which claims priority to U.S. provisional patent application 62/240,812 filed Oct. 13, 2015 to Meyers et al., entitled "Organotin Oxide Hydroxide Patterning Compositions With Precursor Vapor Deposition," and to U.S. provisional patent application 62/297,540 filed Feb. 19, 2016 to Cardineau et al., entitled "Precursor Compositions for Organotin Oxide Hydroxide Photoresist Films," all of which are incorporated herein by reference.

FIELD OF THE INVENTION

The invention relates to precursor compositions that can be coated and in situ hydrolysed to form coatings comprising organotin oxide hydroxide. The invention further relates to radiation sensitive organotin oxide hydroxide coatings that can be patterned effectively with UV light, EUV light or electron-beam radiation to form high resolution patterns with low line width roughness.

BACKGROUND OF THE INVENTION

For the formation of semiconductor-based devices as well as other electronic devices or other complex fine structures, materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for a negative-tone resist, the unexposed regions are more readily removable.

Generally, the pattern can be developed with radiation, a reactive gas, or liquid solution to remove the selectively sensitive portion of the resist while the other portions of the resist act as a protective etch-resistant layer. Liquid developers can be particularly effective for developing the latent image. The substrate can be selectively etched through the windows or gaps in the remaining areas of the protective resist layer. Alternatively, materials can be deposited into the exposed regions of the underlying substrate through the developed windows or gaps in the remaining areas of the protective resist layer. Ultimately, the protective resist layer is removed. The process can be repeated to form additional layers of patterned material. The materials can be deposited using chemical vapor deposition, physical vapor deposition or other desired approaches. Additional processing steps can be used, such as the deposition of conductive materials or implantation of dopants. In the fields of micro- and nano-fabrication, feature sizes in integrated circuits have become very small to achieve high-integration densities and improve circuit function.

SUMMARY OF THE INVENTION

In a first aspect, the invention pertains to a coating solution comprising an organic solvent, a first organometallic composition, and a metal compound with hydrolysable ligand-metal bonds.

In some embodiments, the first organometallic composition can be represented by the formula $R_z SnO_{(2-(z/2)-(x/2))}(OH)_x$ where $0<z\leq2$ and $0<(z+x)\leq4$, by the formula $R_n SnX_{4-n}$ where n=1 or 2, or a mixture thereof, in which R is a hydrocarbyl group with 1-31 carbon atoms, and X is a ligand with a hydrolysable M-X bond. The hydrolysable metal compound can be represented by the formula $MX'_n$, where M is a metal chosen from groups 2-16 of the periodic table of elements, X' is a ligand with a hydrolysable M-X' bond or a combination thereof, and n is determined by the valency of the metal and the ligand charge.

In a further aspect, the invention pertains to a coating solution comprising an organic solvent, at least about 10 mole percent relative to total metal content of a first organometallic composition, and at least 10 mole percent relative to total metal content of a second organometallic composition. In some embodiments, the first organometallic composition can be represented by the formula $R_z SnO_{(2-(z/2)-(x/2))}(OH)_x$ where $0<z\leq2$ and $0<(z+x)\leq4$, by the formula $R_n SnX_{4-n}$ where n=1 or 2, or a mixture thereof, in which R is a hydrocarbyl group, and Sn—X is a hydrolysable chemical bond. The second organometallic composition can be represented by the formula $R'_y SnX'_{4-y}$ where y=1 or 2, in which R' is a hydrocarbyl group that is different from R, and X' is a ligand having a hydrolysable Sn—X' bond that is the same or different from X.

In another aspect, the invention pertains to a method for forming a radiation patternable coating, the method comprising exposing a precursor coating on a substrate to water vapor, in which the precursor coating comprises a first organometallic composition, and a second hydrolysable composition. The first organometallic composition can be represented by the formula $R_z SnO_{(2-(z/2)-(x/2))}(OH)_x$ where $0<z\leq2$ and $0<(z+x)\leq4$, or $R'_n SnX_{4-n}$ where n=1 or 2 and R and R' are independently hydrocarbyl groups with 1-31 carbon atoms. The second hydrolysable composition can be either a second organometallic composition represented by the formula $R'''_y SnX'_{4-y}$ where y=1 or 2 and R' is different from R' and X' is a ligand with a hydrolysable Sn—X' bond that is the same or different from X, or an inorganic composition $ML_v$, where v is $2\leq v \leq 6$ and L is a ligand with a hydrolysable M-L bond that is the same or different from X and X'. In some embodiments, the exposing step results in hydrolysis of the precursor coating compounds to form a coating comprising $((R \text{ or } R')_a R''_b) SnO_{(2-((a+b)/2)-(w/2))}(OH)_w$, where $0<(a+b)\leq2$ and $0<(a+b+w)<4$; or comprising $y((R \text{ or } R')_a R''_b) SnO_{(2-((a+b)/2)-(w/2))}(OH)_w \cdot z\ MO_{((m/2)-1/2)}(OH)_1$ where $0<(a+b)\leq2$, $0<(a+b+w)<4$, m=formal valence of $M^{m+}$, $0\leq1\leq m$, y/z=(0.05 to 0.6), and M=M' or Sn, where M' is a non-tin metal of groups 2-16 of the periodic table.

In additional aspects, the invention pertains to a method for forming a radiation patternable coating comprising a metal oxo-hydroxo network with metal cations having organic ligands with metal carbon bonds and metal oxygen bonds, the method comprising inputting into a deposition chamber closed from the ambient atmosphere separately a first precursor vapor comprising a compound $R_nSnX_{4-n}$ where n=1 or 2, wherein R is a hydrocarbyl group with 1-31 carbon atoms, and X is a hydrolysable or oxidizable ligand and a second precursor vapor comprising an oxygen containing compound capable of hydrolyzing or oxidizing the first precursor vapor under conditions in the deposition chamber to form a hydrolyzed or oxidized composition. Generally, a substrate can be configured with a surface to receive the hydrolyzed or oxidized composition.

In other aspects, the invention pertains to a coated substrate comprising a substrate with a surface and a coating on the surface comprising an organometallic composition represented by the y $(R_zSnO_{(2-(z/2)-(w/2))}(OH)_w) \cdot z\ MO_{((m/2)-1/2)}(OH)_1$ where $0<z\leq2$, $0<(z+w)\leq4$, m=formal valence of $M^{m+}$, $0\leq1\leq m$, y/z=(0.05 to 0.6), and M=M' or Sn, where M' is a non-tin metal of groups 2-16 of the periodic table, and R is hydrocarbyl groups with 1-31 carbon atoms.

Furthermore, the invention pertains to a substrate and a radiation sensitive coating comprising an alkyl metal oxide hydroxide having a dose-to-gel ($D_g$) of no more than about 6.125 mJ/cm$^2$.

Moreover, the invention pertains to a substrate comprising an inorganic semiconductor layer and a radiation sensitive coating material along a surface. In some embodiments, the radiation coating material can be patterned with EUV light at a wavelength of 13.5 nm in a pattern of 16-nm lines on a 32-nm pitch to achieve a critical dimension of 16 nm with a dose from about 8 mJ/cm2 to about 25 mJ/cm2 with a line width roughness of no more than about 4 nm. The radiation sensitive coating material can comprise metal, such as Sn, and can comprise at least 5 weight percent metal and in other embodiments at least about 20 weight percent metal.

BRIEF DESCRIPTION OF THE DRAWINGS

FIG. 1 is a schematic perspective view of a radiation patterned structure with a latent image.

FIG. 2 is a side plan view of the structure of FIG. 1.

FIG. 3 is a schematic perspective view of the structure of FIG. 1 after development of the latent image to remove un-irradiated coating material to form a patterned structure.

FIG. 4 is a side view of the patterned structure of FIG. 3.

DETAILED DESCRIPTION OF THE INVENTION

Figure 5:
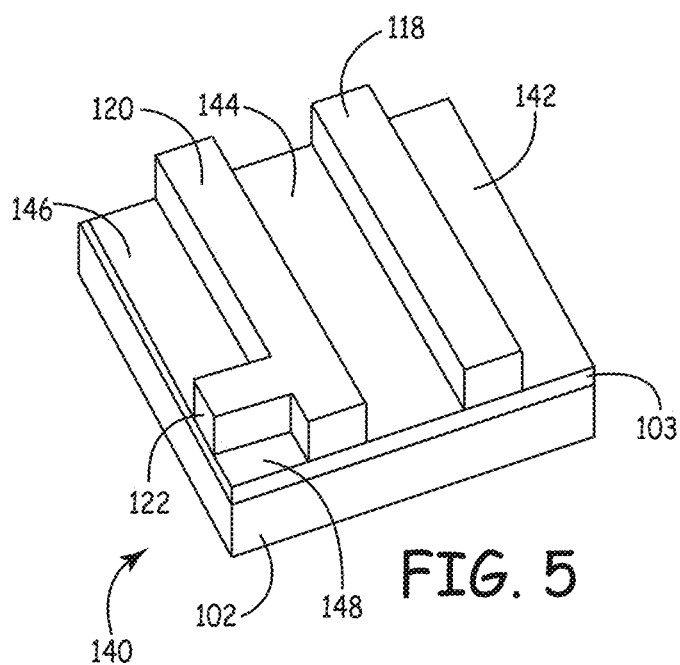
FIG. 5 is a schematic perspective view of the structure of FIG. 1 after development of the latent image to remove irradiated coating material to form a patterned structure.

Improved patterning performance at lower radiation doses can be obtained using organotin patterning compositions with a selected ratio of radiation sensitive alkyl-Sn bonds and/or a selected amount of tin precursors free of radiation sensitive ligands, and improved processing of the radiation patternable coatings can be achieved using in situ solvolysis, e.g., hydrolysis, of the precursor compositions. The radiation patternable coatings generally comprise $R_zSnO_{(2-(z/2)-(x/2))}(OH)_x$ compositions, where $0<z\leq2$ and $0<(z+x)\leq4$, and R is a radiation sensitive alkyl ligand, which in some embodiments can exhibit improved low-dose radiation patterning when formed with a selected amount of $SnX_4$ precursor compounds to modify the value of z for the overall composition. The use of in situ hydrolysis allows for the effective use of precursor compositions through solution based processing that would be difficult or impossible to achieve through the direct dissolution and deposition of alkyl tin oxo-hydroxo compositions. As described herein, processing is improved through in situ solvolysis to form the patternable $R_zSnO_{(2-(z/2)-(x/2))}(OH)_x$ compositions. Vapor deposition can be useful for the deposition of certain precursor coatings as an alternative to solution based processing to form the organotin oxide hydroxide precursors. The patterning compositions are particularly useful for EUV patterning at reduced doses, and low line width roughness can be obtained for small features.

Organotin oxide hydroxides with the general formula $R_zSnO_{(2-(z/2)-(x/2))}(OH)_x$ where $0<(x+z)<4$ and $z>0$ have been found to offer excellent performance as patterning materials, commonly known as photoresists, when deposited as thin coatings and exposed with Ultraviolet (UV), Extreme Ultraviolet (EUV), or electron-beam radiation and developed with appropriate solvents. Previous work has shown that organotin oxide hydroxides can provide a basis for the formation of stable precursor solutions that can form resist layers providing good radiation absorption and development rate contrast. The organotin compositions are effectively used as negative resists or positive resists. The efficacy of these compounds for EUV and electron-beam resists is described in U.S. Pat. No. 9,310,684 B2 to Meyers et al., entitled "Organometallic Solution Based High Resolution Patterning Compositions," incorporated herein by reference. Based on the current synthesis approaches, it seems appropriate to extend these compounds to extend to the value of (x+z)=4 so that $0<(x+z)\leq4$ Improved patterning performance found with branched alkyl ligands and blends of alkyl tin oxide hydroxide compositions is described in published U.S. patent application 2016/0116839 A1 to Meyers et al. (hereinafter the '839 application), entitled "Organometallic Solution Based High Resolution Patterning Compositions and Corresponding Methods" incorporated herein by reference.

The foregoing references describe organotin oxide hydroxide photoresist film deposition by coating precursor solutions containing $R_zSnO_{(2-(z/2)-(x/2))}(OH)_x$ compositions prepared by pre-hydrolysis of one or more $R_nSnX_{(4-n)}$ compositions where (n=1 or 2), isolation and purification of the organotin hydrolysate(s), and dissolution of the oxide hydroxide(s) in a suitable solvent or mixture thereof. However, the dissolution and coating of pre-hydrolysed organotin oxide hydroxides may have substantial constraints on the accessible ligand identities and stoichiometries mandated by the avoidance of poor solubility of one or more hydrolysates, as well as complex hydrolysis processes for some embodiments which have the potential to introduce undesirable contaminates. Moreover, even if soluble resist precursor solutions can be prepared of the organotin oxide hydroxide precursor compositions, undesirable solvents may be required, or film morphology may be impaired.

It has been discovered that many of these constraints may be overcome by the preparation of resist precursor solutions consisting of one or more suitable $R_nSnX_{(4-n)}$ compounds dissolved in an appropriate solvent or mixture of solvents, where X is a ligand with a hydrolysable Sn—X bond. If the precursor $R_nSnX_{(4-n)}$ is sufficiently reactive with water vapor, it can undergo in situ -M-X hydrolysis and condensation in the presence of water to produce the corresponding oxide hydroxide as illustrated in the following general reactions:

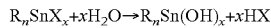

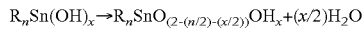

where $(0<(x+z)\leq 4)$. Thus, by the use of coating solutions comprising the $R_nSnX_{(4-n)}$ compounds, a greater range of $R_zSnO_{(2-(z/2)-(x/2))}(OH)_x$ compositions can be formed in practical procedures as photoresist coatings. In these methods the R—Sn moiety is at least partially preserved through the hydrolysis and condensation process, and the resulting film has both M-C and M-O bonds.

In one embodiment of an in situ hydrolysis process, a precursor $R_nSnX_{(4-n)}$ is dissolved in a solvent, directly coated on a substrate, optionally in the presence of water vapor (such as moist air), to produce a coating, and then additionally or alternatively baked further in the presence of water vapor to form the organotin oxide hydroxide coating. Thus, water vapor for hydrolysis can be present during coating deposition and/or during a pre-patterning bake step to perform the in situ hydrolysis. Additionally, by blending multiple $R_nSnX_{(4-n)}$ compounds where n=0, 1, or 2 (such as $SnX_4$, $RSnX'_3$, $R'SnX''_3$ and $R''_2SnX_2$, where R, R', and R" are the same or different and X, X', and X" are the same or different) in a suitable solvent an $R_zSnO_{(2-(z/2)-(x/2))}(OH)_x$ (s) film of selected stoichiometry in the range $0<z\leq 2$ and $0<(x+z)\leq 4$ may be readily deposited. Similarly, mixed-ligand hydrolysates comprising a mixture of an organotin oxide hydroxide $R_zSnO_{(2-(z/2)-(x/2))}(OH)_x$ (where $0<(x+z)<4$ and $z>0$) with one or more different organotin oxides $R'_bSnO_{(2-(b/2)-(a/2))}(OH)_a$ (where $0<(a+b)<4$ and $b>0$) and where $R'\neq R$ can be similarly prepared by this method. Hydrolysable $R_nSnX_{(4-n)}$ and $R'_bSnX_{(4-b)}$ compounds can be dissolved in a common solvent or mixture of solvents and spin-coated on a substrate for in situ hydrolysis. In both cases the high solubility and rapid hydrolyses of suitable molecular organotin precursor compounds advantageously sidesteps potential solubility restrictions of the target organotin oxide hydroxide hydrolysates and eliminates the need for complicated and sensitive synthetic procedures to isolate hydrolyzed and partially condensed resist precursors ex situ. In this manner resist precursor preparation can be significantly simplified and desirable compositions with improved performance are enabled.

In another embodiment, the relatively high vapor pressures and reactivity of many molecular $R_nSnX_{(4-n)}$ compounds enable the use of vapor deposition methods for deposition of organotin oxide hydroxide thin-film photoresists. Potential deposition methods include, for example, physical vapor deposition (PVD), chemical vapor deposition (CVD), atomic layer deposition (ALD), or modifications thereof. For example, one or more gaseous $R_nSnX_{(4-n)}$ compounds can be introduced to a reaction chamber and reacted with a co-precursor such as $H_2O$ or its associated decomposition products, either in the gas phase or on a substrates surface, thereby producing a radiation sensitive organotin oxide hydroxide coating. If the hydrolysable compound is deposited on the surface with a subsequent hydrolysis reaction, this process can be considered a PVD deposition with in situ hydrolysis, but if the hydrolysis takes place during a continuous deposition process, it can be considered a CVD process. Likewise, if the hydrolysable precursor is sequentially adsorbed, chemisorbed, or decomposed on the substrate surface, and the residual film reacted with a second reactive precursor through multiple deposition/reaction cycles to deposit the corresponding organotin oxide hydroxide it can considered an ALD process. Advantages of vapor deposition methods may include reduced resist film defect density, improved thickness and compositional uniformity, as well as conformal and side-wall coating of substrate topography.

Organotin oxide hydroxide photoresist performance, including for example imaging dose, ultimate resolution, and line-width roughness (LWR), has been found to be dependent upon the composition of the photoresist coating. For these photoresist films with the composition $R_zSnO_{(2-(z/2)-(x/2))}(OH)_x$ where $0<(x+z)\leq 4$ and $z>0$, both the identity of the radiation sensitive ligand R, as well as the R:Sn stoichiometry represented by z are significant variables. Generally, the photo resist film can comprise sufficient radiation sensitive ligands R such that the thin film has a molar concentration ratio of radiation sensitive ligands to metal cations (z) from about 0.1 to about 2. Organotin oxide hydroxide resist films with ligand ratios in this range may be prepared by pre-hydrolysis of multiple $R_nSnX_{(4-n)}$ precursors with z=1 or 2 in the appropriate stoichiometry, and dissolution of the resulting hydrolysates in a coating solvent, subject to solubility and stability constraints. Certain stoichiometries, particularly those with $0.1<z<1$, the photoresist compositions have been found to exhibit advantageous photoresist properties. However, for photoresist compositions with $z<1$, the aforementioned processing constraints may be onerous as the solubility of inorganic $SnO_{(2-(x/2))}(OH)_x$ hydrolysates (z=0) is typically extremely low in organic solvents, outside of very limited conditions favoring co-hydrolysis and cluster condensation with specific organotin $RSnX_3$ or $R_2SnX_2$ moieties. Moreover, even when such conditions have been identified and hydrolysates isolated and dissolved, the precursor solution stability, stoichiometry, ligand identity, and solvent may be detrimentally limited relative to desirable values for operation as an EUV photoresist.

These processing and composition constraints can be overcome by adding readily hydrolysable $SnX_4$ compounds directly to precursor coating solutions containing one or more pre-hydrolysed organotin oxide hydroxides, or one or more $RSnX_3$ and/or $R_2SnX_2$ compounds chosen to undergo substantially complete hydrolysis and subsequent condensation along with HX by-product volatization on coating and baking in the presence of water, or another suitable source of oxygen and hydrogen. In this way both the identity and relative stoichiometry of multiple radiation sensitive ligands in both the precursor coating solution and photoresist film may be independently controlled across a wide range of total ligand to metal cation ratios, with relaxed solution stability and solubility constraints and simplified precursor synthesis. Thus, appropriately selected $SnX_4$ compositions may be incorporated into precursor mixtures or processes to enable organotin oxide hydroxide vapor deposition with comparable compositions.

By relaxing the stability and solubility constraints inherent to organometallic compounds with both M-C and M-O bonds, alternate metal species may also be added to the precursor coating solution or reactive gas mixture in the form $MX'_n$ where M is a metal cation chosen from group 2-16 metals, and n is determined by the valency of the metal cation and ligand charge, but is generally 3-6. When M≠Sn, the X' ligand may be the same or different as X in $R_nSnX_{(4-n)}$ compounds used in the same formulation. In both cases these ligands and $MX'_n$ are subject to similar criteria; rapid and substantially complete hydrolysis in the presence of $H_2O$ and diffusion and volatilization of X (X') ligand hydrolysis products from the oxide hydroxide film. Alternate metal cations incorporated into the organotin oxide hydroxide coating in this manner may be advantageous for tuning radiation absorption, film density, metal-ligand thermolysis, development rate in preferred developers, or other desired photoresist properties.

The identity and relative stoichiometry of multiple R—Sn moieties present in an organotin oxide hydroxide resist film have been previously found to offer improved patterning performance as described in the '839 application. While the branched alkyl ligands and associated blended compositions described therein are accessible at least in part using pre-hydrolysed organotin oxide hydroxide compounds dissolved in solvents, significant constraints with respect to ligand identity and stoichiometry have been found in the context of practical processing suitable for commercial use. Many of these constraints are associated with hydrolysate solubility. While some mono-organotin hydrolysates such as n-butyltin oxide hydroxide have excellent solubility in a wide range of organic solvents, hydrolysates of mono-tert-butyl tin moieties, e.g. $^tBuSnO_{(3/2-(x/2))}(OH)_x$ where (0<x<3) are often insufficiently soluble in useful solvents and/or desired solution concentrations are difficult to reproduce and/or control. As demonstrated in the '839 application, while it is possible to prepare a solution of $^tBuSnO_{(3/2-(x/2))}(OH)_x$ with methanol and solvent blends derived therefrom, the volatility, flashpoint, and toxicity of methanol render it an undesirable solvent for use in semiconductor manufacturing. Moreover, the low maximum concentration limits the range of film thicknesses accessible, and the compositions of blend precursor formulations and coatings possible. These constraints are obviated in an example below, where high-performance $^t$-$BuSnO_{(3/2-(x/2))}(OH)_x$ photoresist films are demonstrated via spin coating of a solution of $^tBuSn(NEt_2)_3$ in 4-methyl-2-pentanol in the presence of water vapor.

Similarly, the low solubility of hydrolysates, e.g. $MeSnO_{(2-(z/2)-(x/2))}(OH)_x$, of mono-methyl tin moieties limits film thickness and composition ranges of formulations and coatings. However, by preparing resist precursor solutions that comprise readily hydrolysable and highly soluble $MeSnX_3$ compounds resist films comprising the resulting methyl-tin oxide hydroxide in blended formulations with $^tBuSnO_{(3/2-(x/2))}(OH)_x$ have been deposited and found to offer advantageous lithographic performance. Significantly, using the methods and precursor solutions disclosed herein, resist precursor solution solvent restrictions are substantially relaxed, and resist film stoichiometry can be more readily adjusted to achieve useful lithographic properties. Desirable photoresist precursor solution and subsequent film compositions comprising a mixture of organotin moieties with different organic ligands (R, R', R", etc.) in a wide range of molar ratios with respect to each other and the metal cation are thus accessible by mixing multiple hydrolysable organotin compounds $R_nSnX_{(4-n)} + R'_zSnX'_{(4-z)} + R''_aSnX''_{(4-a)} + \ldots$ (where 0≤(n, z, a)≤2 and at least one of n, z, a, etc.>0).

Alternatively, selected $R_nSnX_{(4-n)}$ compounds where n=0, 1, or 2 may be added to a precursor coating solution containing one or more separately synthesized organotin oxide hydroxide hydrolysates dissolved in an appropriate solvent. Thus, the added $R_nSnX_{(4-n)}$ compounds can hydrolyse on exposure to water vapor or hydroxide moieties, condensing with the initial organotin oxide hydroxides during coating and baking steps to form a coating with an alkyl ligand to metal ratio determined by the stoichiometry of the precursor compounds originally in the precursor coating solution.

The choice of ligand (X) with a hydrolysable Sn—X bond in the aforementioned compounds is significant for the efficacy of solvation, coating, and successful in situ hydrolysis. Appropriate ligands should form a stable bond with Sn in the absence of Lewis acids and generally be strong nucleophiles that rapidly react with acidic protons to produce species which readily desorb or volatilize from the condensing oxide hydroxide film, thereby reducing voids, domain segregation, or other inhomogeneities. For $R_nSnX_{(4-n)}$ compounds, X may be a single unique ligand, however, in certain embodiments, it may refer to a combination of multiple different ligands, e.g. $R_nSnX^1_aX^2_bX^3_cX^4_d$ where a+b+c+d−n=4, and 0≤n≤2. Examples of compounds of this type are $^tBuSn(NEt_2)_2(O^tBu)$ $^tBuSn(NEt_2)(NH_2)(O^tBu)$, $^tBuSn(NEt_2)(O^tBu)_2$, $MeSn(NEt_2)(O^tBu)_2$, $MeSn(NEt_2)_2(O^tBu)$, $(^tBu)_2Sn(NEt_2)(O^tBu)$, $Me_2Sn(NEt_2)(O^tBu)$, $(Me)(^tBu)Sn(NEt_2)_2$, $(Me)(^tBu)Sn(NEt_2)(O^tBu)$, $(^iPr)(^tBu)Sn(NMe_2)(O^tBu)$ and mixtures thereof.

The choice of —X ligand(s) may be determined in part by the identity of the hydrocarbyl ligand R, other hydrolysable ligands, and the stoichiometric ratio, R:Sn, as the reactivity of a given Sn—X moiety with respect to hydrolysis or solvolysis will be modified by the total ligand environment around the metal, both in terms of steric (kinetic) and the electrostatic (thermodynamic) effects.

Formulations comprising one or more $R_nSnX_{(4-n)}$ compound where —X is a short-chain aliphatic dialkylamide —$NR'_2$ or alkoxide —OR' ligand and where R' contains <10 carbon atoms have been found to be particularly suitable for these applications. When exposed to atmospheric moisture during the coating and baking processes, these materials rapidly hydrolyse and condense with other organotin precursor constituents as described above, releasing volatile dialkylamines and alcohols and forming organotin oxide hydroxides with excellent photoresist performance. Other useful ligands of this type include, amido, alkylamido, dialkylamido, alkoxo, aryloxo, azido, imido and others known to those skilled in the art.

In some embodiments, such as the dissolution of an organotin dialkylamide in a protic solvent such as an alcohol, the tin precursor compound may react with the solvent. Through solvolysis, such as alcoholysis when the solvent is an alcohol, or similar reactions, full or partial ligand metathesis may occur as illustrated in the reaction below.

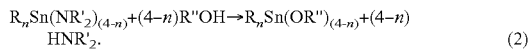
(2)

Such solvolysis and metathesis reactions in equation 2 are anticipated and acceptable as well as potentially even beneficial provided the product tin species (such as a tin (IV) alkoxide, $R_n Sn(OR'')_{(4-n)}$) has the necessary attributes with respect to water reactivity, hydrolysis byproduct volatility, diffusivity, and other attributes discussed herein to produce an appropriate oxide hydroxide film upon coating and baking in an appropriately humid environment.

The improved precursors described herein open up more possibilities for compositions of patternable coatings based on reasonable coating solutions and in situ hydrolysis. In situ hydrolysis provides the capability for a range of vapor phase deposition approaches as appropriate alternatives to solution based processing. Through the ability to adjust the composition of patternable coatings with radiation sensitive ligands, improved patterning with lower radiation doses and good pattern quality has been achieved.

Precursor Compositions

The precursor compositions for forming the resist coatings generally comprise tin cations with appropriate radiation sensitive hydrocarbyl stabilizing ligands and additional ligands with a hydrolysable bond to Sn selected for processing. For processing into a patternable coating, the precursor compositions are generally formed into a solution with a solvent, generally an organic solvent that can be formed into a coating through solution coating or a vapor based deposition process. The ultimate resist coatings are based on metal oxide chemistry, and the precursor solutions of tin cations with alkyl ligands provide stable solutions with good resist properties. The ligands of the precursor solutions are generally selected to facilitate solution formation and related processing functions. As noted above, precursor compositions with a ligand having a hydrolysable bond with Sn can be introduced into the precursor solutions to improve the range of compositions that can be formed into stable solutions with the expectation that subsequent hydrolysis can provide for patternable coatings with organotin oxide hydroxide materials. Compositions with blends of alkyl ligands, generally with at least one branched alkyl ligand, have been found to provide desirable patterning properties.

The alkyl ligands provide the radiation sensitivity, and the particular selection of ligands and stoichiometry relative to the metal can influence the radiation sensitivity. Also, the precursor solutions can be designed to achieve desired levels of radiation absorption for a selected radiation energy based on the selection of the metal cations as well as the associated ligands. While the discussion above outlines in significant detail the ranges of precursor compositions suitable for the improved processing described herein, more details are presented on the use of alkyltin amido/alkoxy precursor compositions for in situ hydrolysis. As noted above, various compounds are described that can provide improved solubility in desirable solvents with good processability into radiation sensitive coatings. A wide range of precursor engineering is made possible through the new classes of precursors involving at least some in situ hydrolysis with some vapor hydrolysis/oxidizing reactants, to form the radiation patternable coatings.

In general, precursor solutions can comprise:

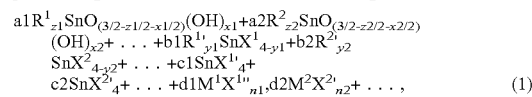

where $a1+a2+ \ldots +b1+b2+ \ldots +c1+c2+ \ldots +d1+d2+ \ldots =1$, i.e., these parameters correspond with mole fractions of metal in the precursor compositions in the solution, $(0 \le (a1, a2, \ldots) \le 0.99)$, $(0 \le (b1, b2, \ldots) \le 1)$, $(0 \le (c1, c2, \ldots) \le 0.6)$, $(0 \le (d1, d2, \ldots) \le 0.5)$ with $0.01 < (b1+b2+ \ldots +c1+c2+ \ldots)$, R ($R^1$, $R^2$, ...) and R' ($R^{1'}$, $R^{2'}$, ...) are independently hydrocarbyl groups or a combination thereof, X ($X^1$, $X^2$, ...), X' ($X^{1'}$, $X^{2'}$, ...) and X'' ($X^{1''}$, $X^{2''}$, ...) are independently ligands with hydrolysable bonds to the associated metal or combinations thereof, $M^1$, $M^2$, ... are a non-tin metal ions, $(0 < (x1, x2, \ldots) < 3)$, $(0 < (z1, z2, \ldots) \le 2)$, $(1 < (y1, y2, \ldots) \le 3)$, and n1, n2, ... are determined by the valency of $M^1$, $M^2$, ... ions and the charge on $X1''$, $X^{2''}$ ... In general, M is a Group 2-Group 16 metal, and for many metals n ranges from 2 to 6. Desirable metals for M may include Hf, Zr, W, Ta, Co, Ni, In, Sb, Bi, Te or others. Representative suitable $ML''_n$ compounds include, for example, $Zr(OtBu)_4$, $Hf(NMe)_4$, $In(O^iPr)_3$, which are available commercially from Sigma-Aldrich, Alfa Aesar, Gelest, Strem Chemical, and other suppliers. In some embodiments, all "a" parameter values are zero such that all of the ligands are hydrolysed in situ. In further embodiments, $0.1 \le (a1, a2, \ldots) \le 0.90$, or $0.2 \le (a1, a2, \ldots) \le 0.85$ or $0.25 \le (a1, a2, \ldots) \le 0.75$. In some embodiments, $0.25 \le (b1, b2, \ldots) \le 1$ or $0.3 \le (b1, b2, \ldots) \le 0.95$ or $0.35 \le (b1, b2, \ldots) \le 0.9$. In additional embodiments, $0 \le (c1, c2, \ldots) \le 0.4$ or $0.025 \le (c1, c2, \ldots) \le 0.4$ or $0.05 \le (c1, c2, \ldots) \le 0.35$ or $0.1 \le (c1, c2, \ldots) \le 0.3$, and $0 < (d1, d2, \ldots) \le 0.5$ or $0.025 \le (d1, d2, \ldots) \le 0.4$ or $0.05 \le (d1, d2, \ldots) \le 0.3$. A person of ordinary skill in the art will recognize that additional ranges of "a", "b", "c", and "d" parameters within the explicit ranges above are contemplated and are within the present disclosure. As used herein the symbols "<" and "≤" implicitly carry the concept of the corresponding range limit being "about" the specified value within experimental error.

In summary, precursor compositions can comprise one or more compounds with at least one having ligands with hydrolysable bonds to the metal and one or more having a hydrocarbyl ligand to provide radiation sensitivity. The compositions are generally engineered to be processable using suitable organic solvents for the formation into precursor solutions as described in the following section. The precursors generally are engineered to provide desirable patterning properties as well as good processability.

In some embodiments, the precursor compositions can comprise mixtures of two organotin compounds with different hydrocarbyl ligands, three organotin compounds with different hydrocarbyl ligands, or more than three organotin compounds with different hydrocarbyl ligands. In addition, precursor compositions can comprise a mixture of compounds without metal-carbon bonds and one or more compounds with radiation sensitive alkyl ligands having metal-carbon bonds. Generally, for binary or tertiary mixtures, the mixture comprises at least about 5 mole percent of each component with distinct hydrocarbyl ligands, in some embodiments at least about 10 mole percent and in further embodiments at least about 20 mole percent of each component with distinct hydrocarbyl ligands. A person of ordinary skill in the art will recognize that additional ranges of mole percent of components within the explicit ranges above are contemplated and are within the present disclosure.

In some embodiments the precursor compositions comprise a mixture of R—Sn moieties with hydrocarbyl ligands and inorganic metal $SnX_4$ or $MX_n$ compounds without alkyl ligands bound directly to the metal. Generally, these mixtures comprises at least about 0.5 mole percent of each metal component, in some embodiments at least about 5 mole percent and in further embodiments at least about 10 mole percent of each component. A person of ordinary skill in the art will recognize that additional ranges of mixture components within the explicit ranges above are contemplated and are within the present disclosure. The components of the precursor compositions may be combined in solution and are not separately formed as solid blends prior to, for example, formation of a coating.

Whether or not there are one or multiple distinct hydrocarbyl ligands, an R group can be a linear, branched, (i.e., secondary or tertiary at the metal bonded carbon atom) or cyclic hydrocarbyl group. Each R group individually generally has from 1 to 31 carbon atoms with 3 to 31 carbon atoms for the secondary-bonded carbon atom and 4 to 31 carbon atoms for the tertiary-bonded carbon atom embodiments, for example, methyl, ethyl, propyl, butyl, and branched alkyl. In particular, branched alkyl ligands are desirable where the compound can be represented in another representation by $R^1R^2R^3CSnX_3$, where $R^1$ and $R^2$ are independently an alkyl group with 1-10 carbon atoms, and $R^3$ is hydrogen or an alkyl group with 1-10 carbon atoms. In some embodiments $R^1$ and $R^2$ can form a cyclic alkyl moiety, and $R_3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CHCH_3$), sec-butyl ($R^1$ is methyl, $R^2$ is —$CHCH_3$, and $R^3$ is hydrogen), cyclohexyl, cyclopentyl, cyclobutyl, and cyclopropyl. Examples of suitable cyclic groups include, for example, 1-adamantyl (—$C(CH_2)_3(CH)_3(CH_2)_3$ or tricyclo(3.3.1.13,7) decane bonded to the metal at a tertiary carbon) and 2-adamantyl (—$CH(CH)_2(CH_2)_4(CH)_2(CH_2)$ or tricyclo(3.3.1.13,7) decane bonded to the metal at a secondary carbon). In other embodiments hydrocarbyl groups may include aryl, or alkenyl groups, for example benzyl, allyl, or alkynyl groups. In other embodiments the hydrocarbyl ligand R may include any group consisting solely of C and H, and containing 1-31 carbon atoms. For example: linear or branched alkyl ($^iPr$, $^tBu$, Me, $^nBu$), cyclo-alkyl (cyclo-propyl, cyclo-butyl, cyclo-pentyl), olefinic (alkenyl, aryl, allylic), or alkynyl groups, or combinations thereof. In further embodiments suitable R-groups may include hydrocarble groups substituted with heteroatom functional groups including cyano, thio, silyl, ether, keto, ester, or halogenated groups or combinations thereof.

Some suitable metal compositions with desired ligand structures can be purchased from commercial sources, such as Alfa Aesar (MA, USA) and TCI America (OR, USA), and other metal-ligand compositions can be synthesized as described below. Low metal contaminant precursor compositions can be synthesized using the methods described herein based on the use of suitably low contaminated starting materials and appropriate purification.

Desirable patterning results have been obtained using a precursor compound with branched alkyl ligands. But fuller advantage of ligand selection has been achieved through the use of mixed alkyl ligands, as separately advantageous patterning properties such as dose and line-width-roughness imparted by different ligands may be obtained through the teachings herein through blending of multiple alkyl ligands as illustrated in the examples provided. The processing with in situ hydrolysed precursors provides for effective use of tin compounds with methyl ligands in the precursor solutions based on desirable solvents. Effective patterning with a mixture of tert-butyl ligands and methyl ligands is described in the Examples below as well as a precursor comprising a mixture of a hydrolysable compound with t-butyl ligands and hydrolysable $SnX_4$ compounds (X=$NMe_2$- or X=$O^tBu$).

It has been found that the radiation curing doses can scale approximately linearly for mixtures of precursor compounds with different alkyl ligands based on the radiation doses for the respective individual precursor compounds. Due to the lower radiation doses that can be used with the branched alkyl ligands, it is generally desirable for the mixtures to comprise at least one branched organic ligand. But correspondingly it has been discovered that the line width roughness can be improved with mixtures of precursor compounds with different organic ligands. While not wanting to be limited by theory, it is possible that the improved line width roughness values observed for the mixture compositions may be due to facilitated etchings for the mixture compositions without significantly diminishing the contrast in the pattern. In this context, the observations may extend to mixture compositions containing combinations of organotin compounds bearing branched or unbranched alkyls.

X, X', and X" ligands are generally Lewis bases that can react suitably with acidic protons of water or other Lewis acids via hydrolysis or solvolysis of M-X, M-X' and M-X" bonds to form readily volatilized products. Alternatively these ligands may react with an appropriate reagent via oxidation or reduction reactions to form readily volatilized products. Ligands may generally be classified by the acid dissociation constant ($pK_a$) of their conjugate acids, where desirable ligands for some embodiments have conjugate acid pKas greater than about 4. Thus, X, X' and X" generally comprise an atom binding to the metal, e.g., tin, that can undergo nucleophilic substitution involving $H_2O$ and —OH. The resulting M-OH or M-$OH_2$ ligands may then react via subsequent condensation or dehydration steps to form an oxide-hydroxide network.

Suitable ligands comprise alkylamido or dialkylamido (—$NR^1R^2$, where $R^1$ and $R^2$ are independently hydrocarbon groups with 1-10 carbon atoms or hydrogen), siloxo (—$OSiR^1R^2 R^3$, where $R^1$, $R^{2'}$ are independently hydrocarbon groups with 1-10 carbon atoms), silylamido (—N($SiR^1_3)(R^2)$, where $R^1$ and $R^2$ are independently hydrocarbon groups with 1-10 carbon atoms), disilylamido (—N($SiR^1_3)(SiR^2_3)$ where $R^1$ and $R^2$ are independently hydrocarbon groups with 1-10 carbon atoms), alkoxo and aryloxo (—OR, where R is an alkyl or aryl group with 1-10 carbon atoms), azido (—$N_3$), alkynido (—C≡CR, where R is a hydrocarbon group with 1-9 carbon atoms), amidato (—$NR^1(COR^2)$ where $R^1$ and $R^2$ are independently hydrocarbon groups with 1-7 carbon atoms or hydrogen), amidinato (—$NR^1C(NR^2)R^3$) where $R^1$ and $R^2$ are independently hydrocarbon groups with 1-8 carbon atoms or hydrogen), imido (—$N(COR^1)(COR^2)$, where $R^1$ and $R^2$ are independently hydrocarbon groups with 1-8 carbon atoms or hydrogen), or fluorinated analogues thereof.

The metal in an inorganic or organometallic material can significantly influence the absorption of radiation. Tin provides strong absorption of extreme ultraviolet light at 13.5 nm. In combination with alkyl ligands, metals also provide strong absorption of ultraviolet light at 193 nm wavelength. Tin also provides good absorption of electron-beam radiation. The energy absorbed is modulated by the metal-organic interactions, which can result in the rupturing of the metal-ligand bond and the desired control over the material properties. Nevertheless, other metal compositions can be introduced to further influence the absorption properties and overall resist performance. As noted above, other non-tin metals are generally introduced as $MX_n$, where X is a ligand having a hydrolysable bond to the metal.

The use of precursor compounds with ligands having hydrolysable bonds to the metal can simplify the preparation of the precursor solutions since in situ hydrolysis avoids the many synthetic and isolation steps required to produce a defined hydrolysis product. In particular, the solution phase hydrolysis and subsequent condensation and isolation of an organotin oxide hydroxide hydrolysate can involve significant solubility changes during the reaction, so that avoiding this solution based step avoids a potentially difficult process step. To the extent that an ingredient of the precursor composition comprises a separately hydrolysed component, this particular component can be obtained using a solution based hydrolysis, such as using a base catalyzed aqueous solution, as described in the '839 application. The components with ligands having hydrolysable bonds to the metal can generally be purchased or synthesized from appropriate starting materials, for example from a tin halide composition or tetrakis(dialkylamido)tin composition, as noted in the Examples.

Precursor Solution Formations and Coating Properties

A range of precursor solutions can be formulated based on the compositions described in the previous section. The precursor compositions generally have the commonality of involving some degree of hydrolytically sensitive metal-ligand bonds. For precursor compounds having sufficient vapor pressure, the hydrolysis can be alternatively performed in situ in a coating or as part of a vapor phase deposition process. The precursor solutions for solution deposition generally comprise tin cations and optionally one or more non-tin metal cations in an organic solvent.

The concentration of ligand stabilized metal cations in the solution can be selected to provide suitable solution properties for a particular solution deposition approach, such as spin coating, slot coating, dip coating, spray or aerosol coating, or printing, and are designed to form a coating composition upon at least partial solvent removal and ultimately an inorganic solid dominated by tin oxides upon irradiation and/or thermal treatment, exposure to a plasma, or similar processing.

With the precursor solutions based on alkyl-stabilization ligands and an organic solvent, progression to the oxide can be controlled as part of the procedure for processing the solution first to a coating material and then to the ultimate metal oxide composition with organic ligands through hydrolysis and condensation reactions with ambient water vapor during coating and/or hydrolysis and condensation following coating. As described herein, alkyl ligands, especially branched alkyl ligands and/or combinations of alkyl ligands in particular stoichiometries relative to the metal, can be used to provide significant control to the processing of the solution to an effective radiation resist composition. Processing with an alcohol based solvent can involve partial or complete substitution of alkoxy ligands from the alcohol for initial ligands with hydrolysable bonds to the metal, but such substitution may not alter downstream processing in any significant way.

A precursor solution concentration can be conveniently specified based on tin ion molar concentration and concentrations of any other metals can be correspondingly specified through the molar fraction values for the metals relative to tin. In general, the precursor solution comprises from about 0.005 M to about 1.4 M tin cation, in further embodiments from about 0.02 M to about 1.2 M, and in additional embodiments from about 0.1 M to about 1.0 M tin cation. Total non-tin metal in the precursor solution generally can range from about 0.025 mole % to about 10 mole % of the total metal ions and in further embodiments from about 10 mole % to about 50 mole % of the total metal ions. A person of ordinary skill in the art will recognize that additional ranges of tin cations within the explicit ranges above are contemplated and are within the present disclosure.

In general, the desired hydrolysate compounds can be dissolved in an organic solvent, e.g., alcohols, aromatic and aliphatic hydrocarbons, esters or combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, 1-butanol, methanol, isopropyl alcohol, 1-propanol), ketones (e.g., methyl ethyl ketone), mixtures thereof, and the like. In general, organic solvent selection can be influenced by solubility parameters, volatility, flammability, toxicity, viscosity and potential chemical interactions with other processing materials. After the components of the solution are dissolved and combined, the character of the species may change as a result of partial in-situ hydrolysis, hydration, and/or condensation. When the composition of the solution is referenced herein, the reference is to the components as added to the solution, since complex formulations may undergo solvolysis and ligand metathesis, or produce metal polynuclear species in solution that may not be well characterized. For certain applications it is desirable for the organic solvent to have a flash point of no less than about 10° C., in further embodiments no less than about 20° C. and in further embodiment no less than about 25° C. and a vapor pressure at 20° C. of no more than about 10 kPa, in some embodiments no more than about 8 kPa and in further embodiments no more than about 6 kPa. A person of ordinary skill in the art will recognize that additional ranges of flash point and vapor pressure within the explicit ranges above are contemplated and are within the present disclosure.

The concentrations of the species in the precursor solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below.

In general, precursor solutions can be well mixed using appropriate mixing apparatuses suitable for the volume of material being formed. Suitable filtration can be used to remove any contaminants or other components that do not appropriately dissolve. In some embodiments, it may be desirable to form separate solutions that can be combined to form the precursor solution from the combination. Specifically, separate solutions can be formed comprising one or more of the compounds indicated above in Formula (1). Generally, the separate solutions or the combined solutions can be well mixed. The resulting solution can be referred to as a stabilized metal cation solution.

Stability of the precursor solutions can be evaluated with respect to changes relative to the initial solution. Specifically, a solution has lost stability if phase separation occurs with the production of large sol particles or if the solution loses its ability to perform desired pattern formation. Based on the improved stabilization approaches described herein, the solutions can be stable for at least about a week without additional mixing, in further embodiments at least about 2 weeks, in other embodiments at least about 4 weeks. A person of ordinary skill in the art will recognize that additional ranges of stabilization times are contemplated and are within the present disclosure. Suitable solutions generally can be formulated with sufficient stabilization times that the solutions can be commercially distributed with appropriate shelf lives.

As described herein, processing approaches have been developed that provide for reduction of metal contamination. Thus, the precursor solutions can be formulated that have very low levels of non-tin metal. In general, the unintentional metal concentrations can all be individually reduced to values of no more than about 1 part per million by weight (ppm) in further embodiments, no more than about 200 parts per billion by weight (ppb), in additional embodiments no more than about 50 ppb, and in other embodiments no more than about 10 ppb. In some embodiments, it may be desirable to add other metal elements to influence processing, and generally these can be identified by levels of at least about 1 weight percent and in some embodiments at least about 2 weight percent, and can thus be distinguished from contaminant metals, if appropriate. Metal contaminants to be decreased in particular include alkali metals and alkaline earth metals, Au, Ag, Cu, Fe, Pd, Pt, Co, Mn, and Ni. A person or ordinary skill in the art will recognize that additional ranges of metal levels within the explicit levels above are contemplated and are within the present disclosure.

Previous efforts to produce precursor solutions and coatings with low metal contamination are described in the '839 application. Using vapor water for hydrolysis provides a hydrolysis reactant substantially free of metal contaminants that can effectively further the formation of a low contaminant patternable coating based on a low contaminant tin composition. Suitable starting materials with low metal contamination can be obtained commercially or through purification.

Coating Processing and Hydrolysis In Situ

A coating material can be formed through deposition and subsequent processing of the precursor solution onto a selected substrate. Using the precursor solutions described herein, some hydrolysis and condensation generally is performed during coating, and may be completed or furthered post coating via subsequent processing steps such as heating in air. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. However, in specific embodiments the substrate may possess substantial topography, where the resist coating is intended to fill or planarize features for particular patterning applications. Alternatively, using the vapor deposition methods described herein, existing topography and features may be conformally coated with organotin oxide hydroxide photo resist for particular patterning applications.

In general, any suitable solution coating process can be used to deliver the precursor solution to a substrate in addition to the vapor deposition processes disclosed herein. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 10 microns, in other embodiments no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about ±25% relative to the average coating thickness. In some embodiments, such as high uniformity coatings on larger substrates, the evaluation of coating uniformity may be evaluated with a 1 centimeter edge exclusion, i.e., the coating uniformity is not evaluated for portions of the coating within 1 centimeter of the edge. A person of ordinary skill in the art will recognize that additional ranges within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. Reactive species may condense during coating or subsequent heating to forming a hydrolysate coating material.

In general, the coating material can be exposed to, and optionally heated in, the presence of atmospheric moisture prior to radiation exposure to hydrolyse the hydrolysable bonds to the metal in the precursor compositions, and/or further drive off solvent and promote densification of the coating material. The coating material following in situ hydrolysis may generally form a polymeric metal oxohydroxo network based on the binding oxo-hydroxo ligands to the metals in which the metals also have some alkyl ligands, or a molecular solid comprised of polynuclear metal oxo/hydroxo species with alkyl ligands.

The hydrolysis/solvent removal process may or may not be quantitatively controlled with respect to precise stoichiometry of the heated coating material and/or specific amounts of solvent remaining in the coating material. Additionally, the formulas and compositions expressed herein may contain some additional water, whether directly bound to Sn, or as hydrogen-bonded component of the network. Empirical evaluation of the resulting coating material properties generally can be performed to select processing conditions that are effective for the patterning process. While heating may not be needed for successful application of the process, it can be desirable to heat the coated substrate to speed the processing and/or to increase the reproducibility of the process and/or to facilitate vaporization of the hydrolysis by products, such as amines and/or alcohols. In embodiments in which heat is applied to remove solvent, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment, hydrolysis, and densification of the coating material, the coating material can exhibit an increase in index of refraction and in absorption of radiation without significant loss of contrast.

Vapor Based Coating Formation

The development of precursor compounds comprising of both R-groups with substantially non-hydrolysable bonds to Sn, and X ligands with hydrolysable bonds to Sn has been exploited for the development of vapor phase deposition of radiation patternable organotin oxide hydroxide coatings. In particular, the relatively high vapor pressures and reactivity of many $R_nSnX_{(4-n)}$ compounds such as those listed in Table 1, make possible the use of vapor deposition methods for deposition of organotin oxide hydroxide thin-film photoresists. Through the introduction the hydrolysable precursors in the vapor phase in a reactor closed from the ambient atmosphere, the hydrolysis can be performed as part of the deposition process, i.e., a chemical vapor deposition.

Potential vapor deposition methods include chemical vapor deposition (CVD), atomic layer deposition (ALD), and modifications thereof, many of which have previously been employed to deposit inorganic metal oxide and nitride films with metal alkylamide, alkoxide, and halide precursors, [1-4] including $SnO_2$ from $Sn(NMe_2)_4$. [5]. To perform the vapor deposition, generally one or more metal-containing precursors are reacted on or more with small molecule gas-phase reagents such as $H_2O$, $H_2O_2$, $O_3$, $O_2$, or $CH_3OH$, which serve as O and H sources for production of oxides and oxide hydroxides. If desired, physical vapor deposition approaches can also be performed in which the precursor compositions with ligands having hydrolysable bonds to Sn are deposited from the vapor phase and the bonds subsequently hydrolysed after coating formation, but for vapor phase processing, hydrolysis/oxidation during the deposition generally may be more efficient.

TABLE 1

| Compound | Vapor Pressure (torr) | Temperature (° C.) |
| --- | --- | --- |
| $^tBuSn(NEt_2)_3$ | 0.3 | 95 |
| $^tBuSn(NMe_2)_3$ | 0.3 | 55 |
| $^tBuSn(O^tBu)3$ | 3.5 | ~82 |
| $^iPrSn(NMe_2)_3$ | 1.4 | 53 |
| $Sn(NEt_2)_4$ | 0.5 | 110 |
| $Sn(NMe_2)_4$ | 0.1 | ~54 |
| $Sn(O^tBu)_4$ | 0.3 | 65 |
| $Sn(O^tAm)4$ | 2 | 120 |
| $MeSn(O^tBu)_3$ | 0.1 | ~57 |
| $^nBuSn(O^tBu)_3$ | 0.9 | 100 |
| $^nBuSn(NMe_2)_3$ | 0.05 | 80 |

In CVD methods, two or more reactant gases are generally mixed in the chamber in the vicinity of the substrate surface. Therefore, sufficient stability can be designed into the reaction conditions to control undesirable vapor-phase reactions and nucleation. ALD precursors, introduced separately and sequentially to the reaction chamber, typically react with chemisorbed co-precursor or decomposition products saturating the substrate surface. Desirable features of $R_nSnX_{(4-n)}$ precursors include, for example, sufficient volatility for vapor-phase transport in the system, thermal stability to prevent premature decomposition, and appropriate reactivity with co-precursors to produce the target product under prescribed process conditions. The pressure and temperature in the reaction chamber can be selected to control the reaction process.

In general, precursors with relatively low vapor pressures may be introduced using flow of vapor, aerosol, and/or direct liquid injection into a vaporization chamber. Flash evaporators can be used to introduce a controlled amount of precursor vapors into the reaction chamber to correspondingly control the reaction process in the chamber. The secondary reactant to drive hydrolysis/oxidation can be introduced through a separate inlet into the chamber. Commercial CVD apparatuses can be adapted for this use or specific equipment can be used. To facilitate deposition the substrate may be heated or may be cooled depending on the precursor properties. Inert gases such as $N_2$, Ar or the like may be used in appropriate capacities as carrier gases, purge gases, or pressure modulating gases in both sequential and continuous flow regimes.

A range of $R_nSnX_{(4-n)}$ compounds where n=0, 1, or 2, or combinations thereof, as demonstrated to produce organotin oxide hydroxide photoresists by hydrolysis in solution or in-situ hydrolysis as discussed herein, may also be suitable for vapor deposition of organotin oxide hydroxide photoresists with desirable properties. Useful X ligands include alkylamido and dialkylamido, chloro, alkoxo, or alkynido, siloxo, silylamido, disilylamido, aryloxo, azido, amidato, amidinato, or fluorinated analogues thereof in combination with hydrocarbyl R groups that include both straight-chain and branched-chain alkyl, cyclo-alkyl, aryl, alkenyl, alkynyl benzyl, and their fluorinated derivatives. Suitable precursors may include, for example, $(CH_3)_3CSn(NMe_2)_3$, $(CH_3)_2CHSn(NMe_2)_3$, $(CH_3)_2(CH_3CH_2)CSn(NMe_2)_3$, $(CH_2)_2CHSn(NMe_2)_3$, $CH_3Sn(NMe_2)_3$, $(CH_2)_3CHSn(NMe_2)_3$, $(CH_2)_4CHSn(NMe_2)_3$, $(C_6H_5)CH_2Sn(NMe_2)_3$, $(C_6H_5)(CH_3)CHSn(NMe_2)_3$, $(C_6H_5)(CH_3)CHSn(NMe_2)_3$, $(CH_3)_2(CN)CSn(NMe_2)_3$, $(CH_3)(CN)CHSn(NMe_2)_3$, or $(CH_3)_3CSn(O^tBu)_3$, $(CH_3)_2CHSn(O^tBu)_3$, $(CH_3)_2(CH_3CH_2)CSn(O^tBu)_3$, $(CH_2)_2CHSn(O^tBu)_3$, $CH_3Sn(O^tBu)_3$, $(CH_2)_3CHSn(O^tBu)_3$, $(CH_2)_4CHSn(O^tBu)_3$, $(C_6H_5)CH_2Sn(O^tBu)_3$, $(C_6H_5)(CH_3)CHSn(O^tBu)_3$, $(C_6H_5)(CH_3)CHSn(O^tBu)_3$, $(CH_3)_2(CN)CSn(O^tBu)_3$, $(CH_3)(CN)CHSn(O^tBu)_3$ or others known to those skilled in the art. Additionally, one or more vapor-phase precursor compounds with =0 such as $Sn(NMe_2)_4$, or $Sn(OtBu)_4$ may be reacted sequentially or concurrently with the organotin-containing precursors to alter the R:Sn ratio in the film to achieve desirable patterning attributes.

Thus hydrolysable compounds can be directly deposited via vapor phase hydrolysis as the corresponding alkyl tin oxide hydroxide coating, which can then be appropriately patterned. Advantages of vapor deposition may include, for example, reduced resist film defect density, improved thickness and compositional uniformity, as well as conformal and side-wall coating of substrate topography.

A vapor deposition method for direct deposition of organotin oxide hydroxides with the general formulae $RSnO_{(3/2-x/2)}(OH)_x$ (0<x<3) and can comprise in some embodiments an inert gas source connected to separate heated bubbler vessels. A first vessel contains a liquid alkyl tris(dialkylamido)tin compound of sufficient vapor pressure to produce suitable partial pressures for transport in the inert carrier gas. A second vessel contains liquid water or a water/alcohol mix. By controlling vessel temperatures, inert gas flow rate, and total system pressure, vapor-phase RSn(NR'$_2$)$_3$ and $H_2O$ are transported independently to a chamber evacuated to <~0.1 Torr, more generally from about 0.01 Torr to about 25 Torr, and in some atmospheric pressure CVD pressures >25 Torr. The precursors therein mix and react to deposit an organotin oxide hydroxide on the substrate. The substrate and/or chamber and/or vapors may be heated to promote reaction and deposition on the substrate surface. Reaction temperatures below about 200° C. can be desirable in some embodiments to limit de-alkylation of the tin compound and/or to prevent excessive dehydration and condensation of the oxide hydroxide. Such oxide hydroxide formation may reduce photoresist dissolution-rate contrast between exposed and unexposed regions. The gases, the chamber walls and/or the substrate can be heated in various embodiments, generally to a temperature from about 40° C. to about 175° C. and in further embodiments from about 50° C. to about 160° C. A person of ordinary skill in the art will recognize that additional ranges of pressure and temperature within the explicit ranges above are contemplated and re within the present disclosure. In a similar, related process, pulses of water vapor, inert gas, and RSn(NR'2)$_3$ of appropriate duration and frequency may be alternated to enable a surface-limited adsorption and reaction regime common to ALD methodologies.

Patterning and Patterned Structure Properties

Following hydrolysis, condensation, and drying, the coating material can be finely patterned using radiation. As noted above, the composition of the precursor solution and thereby the corresponding coating material can be designed for sufficient absorption of a desired form of radiation. The absorption of the radiation results in energy that can break the bonds between the metal and alkyl ligands so that at least some of the alkyl ligands are no longer available to stabilize the material. Radiolysis products, including alkyl ligands or fragments may diffuse out of the film, or not, depending on process variables and the identity of such products. With the absorption of a sufficient amount of radiation, the exposed coating material condenses, i.e. forms an enhanced metal oxo-hydroxo network, which may involve additional water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise chemically altered coating material, and the un-irradiated areas comprise generally the as-formed coating material. As noted below, very smooth edges can be formed upon development of the coating material with the removal of the un-irradiated coating material or alternatively with selective removal of the irradiated coating material.

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron-beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

The amount of electromagnetic radiation can be characterized by a fluence or dose which is defined by the integrated radiative flux over the exposure time. Suitable radiation fluences can be from about 1 mJ/cm$^2$ to about 150 mJ/cm², in further embodiments from about 2 mJ/cm² to about 100 mJ/cm², and in further embodiments from about 3 mJ/cm² to about 50 mJ/cm². A person of ordinary skill in the art will recognize that additional ranges of radiation fluences within the explicit ranges above are contemplated and are within the present disclosure.

With electron-beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron-beam lithography using the inorganic coating materials described herein, the range of the secondary electrons in the inorganic material is limited. Electron beams can be characterized by the energy of the beam, and suitable energies can range from about 5 V to about 200 kV (kilovolt) and in further embodiments from about 7.5 V to about 100 kV. Proximity-corrected beam doses at 30 kV can range from about 0.1 microcoulombs per centimeter squared to about 5 millicoulombs per centimeter squared (mC/cm²), in further embodiments from about 0.5 µC/cm² to about 1 mC/cm² and in other embodiments from about 1 µC/cm² to about 100 µC/cm². A person of ordinary skill in the art can compute corresponding doses at other beam energies based on the teachings herein and will recognize that additional ranges of electron beam properties within the explicit ranges above are contemplated and are within the present disclosure.

Based on the design of the coating material, there can be a large contrast of material properties between the irradiated regions that have condensed coating material and the un-irradiated, coating material with substantially intact organic ligands. It has been found that the contrast at a given dose can be improved with a post-irradiation heat treatment, although satisfactory results can be achieved in some embodiments without post-irradiation heat treatment. The post-exposure heat treatment seems to anneal the irradiated coating material to increase its condensation without significantly condensing the un-irradiated regions of coating material based on thermal breaking of the organic ligand-metal bonds. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

Following exposure with radiation, the coating material is patterned with irradiated regions and un-irradiated regions. Referring to FIGS. 1 and 2, a patterned structure 100 is shown comprising a substrate 102, a thin film 103 and patterned coating material 104. Patterned coating material 104 comprises regions 110, 112, 114, 116 of irradiated coating material and uncondensed regions 118, 120, 122 of un-irradiated coating material. The pattern formed by condensed regions 110, 112, 114, 116 and uncondensed regions 118, 120, 122 represent a latent image into the coating material, and the development of the latent image is discussed in the following section.

Development and Patterned Structure

Development of the image involves the contact of the patterned coating material including the latent image to a developer composition to remove either the un-irradiated coating material to form the negative image or the irradiated coating to form the positive image. Using the resist materials described herein, effective negative patterning or positive patterning generally can be performed with desirable resolution using appropriate developing solutions, and generally based on the same coating. In particular, the irradiated regions are at least partially condensed to increase the metal oxide character so that the irradiated material is resistant to dissolving by organic solvents while the un-irradiated compositions remain soluble in the organic solvents. Reference to a condensed coating material refers to at least partial condensation in the sense of increasing the oxide character of the material relative to an initial material. On the other hand, the un-irradiated material is less soluble in weak aqueous bases or acids due to the hydrophobic nature of the material so that aqueous bases can be used to remove the irradiated material while maintaining the non-irradiated material for positive patterning.

The coating compositions with organic-stabilization ligands produce a material that is inherently hydrophobic. Irradiation to break at least some of the organic metal bonds converts the material into a less hydrophobic, i.e., more hydrophilic, material. This change in character provides for a significant contrast between the irradiated coating and non-irradiated coating that provides for the ability to do both positive tone patterning and negative tone patterning with the same resist composition. Specifically, the irradiated coating material condenses to some degree into a more of a metal oxide composition; however, the degree of condensation generally is moderate without significant heating so that the irradiated material is relatively straightforward to develop with convenient developing agents.

Figure 6:
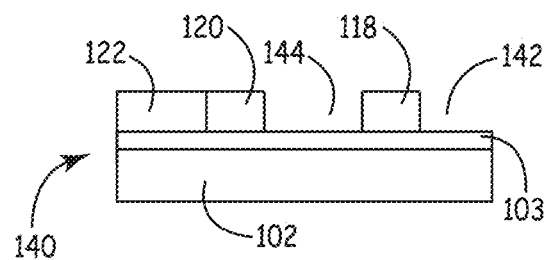
FIG. 6 is a side view of the patterned structure of FIG. 5.

With respect to negative tone imaging, referring to FIGS. 3 and 4, the latent image of the structure shown in FIGS. 1 and 2 has been developed through contact with a developer to form patterned structure 130. After development of the image, substrate 102 is exposed along the top surface through openings 132, 134, 135. Openings 132, 134, 135 are located at the positions of uncondensed regions 118, 120, 122 respectively. With respect to positive tone imaging, referring to FIGS. 5 and 6, the latent image of the structure shown in FIGS. 1 and 2 has been developed to form patterned structure 140. Patterned structure 140 has the conjugate image of patterned structure 130. Patterned structure 140 has substrate 102 exposed at positions of irradiated regions 110, 112, 114, 116 that are developed to form openings 142, 144, 146, 148.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

For positive tone imaging, the developer generally can be aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent, and this concentration can be used for the processing described herein. Furthermore, mixed quaternary tetraalkyl-ammonium hydroxides can be used. In general, the developer can comprise from about 0.5 to about 30 weight percent, in further embodiments from about 1 to about 25 weight percent and in other embodiments from about 1.25 to about 20 weight percent tetraalkylammonium hydroxide or similar quaternary ammonium hydroxides. A person of ordinary skill in the art will recognize that additional ranges of developer concentrations within the explicit ranges above are contemplated and are within the present disclosure.

In addition to the primary developer composition, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, oxalate, ethylenediamine-tetraacetic acid (EDTA), tungstate, molybdate, or the like and combinations thereof. Other potentially useful additives include, for example, molecular chelating agents, such as polyamines, alcohol amines, amino acids, carboxylic acids, or combinations thereof. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of metal oxide particles.

With a weaker developer, e.g., lower concentration aqueous developer, diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, methyl alcohol, ethyl alcohol, propyl alcohol and combinations thereof for negative patterning and ultrapure water for positive patterning. After the image is developed, the coating material is disposed on the substrate as a pattern.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as $O_2$ may also be employed for similar purposes.

With conventional organic resists, structures are susceptible to pattern collapse if the aspect ratio, height divided by width, of a structure becomes too large. Pattern collapse can be associated with mechanical instability of a high aspect ratio structure such that forces, e.g., surface tension, associated with the processing steps distort the structural elements. Low aspect ratio structures are more stable with respect to potential distorting forces. With the patternable coating materials described herein, due to their high etch resistance and the ability to process effectively the structures with thinner layers of coating material, improved patterning can be accomplished without the need for high aspect ratio patterned coating material. Thus, very high resolution features have been formed without resorting to high aspect ratio features in the patterned coating material.

The resulting structures can have sharp edges with very low line-width roughness. In particular, in addition to the ability to reduce line-width roughness, the high contrast also allows for the formation of small features and spaces between features as well as the ability to form very well resolved two-dimensional patterns (e.g., sharp corners). Thus, in some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. Average line-width roughness can be no more than about 5 nm, in some embodiments no more than about 4.5 nm and in further embodiments from about 2.5 nm to about 4 nm. Evaluating line-width roughness is performed by analysis of top-down SEM images to derive a 36 deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of pitch, average widths and line-width roughness within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

Wafer throughput is a substantially limiting factor for implementation of EUV lithography in high-volume semiconductor manufacturing, and is directly related to the dose required to pattern a given feature. However, while chemical strategies exist to reduce imaging dose, a negative correlation between the imaging dose required to print a target feature, and feature size uniformity (such as LWR) is commonly observed for EUV photoresists at feature sizes and pitches <50 nm, thereby limiting final device operability and wafer yields. However, the precursors, precursor solutions, and photoresist film described herein have been found avoid this limitation and enable reduced EUV imaging dose without concomitant increase in LWR over a substantial dose range. By utilizing precursor solutions comprising blends of $R_nSnX_{(4-n)}$ and $SnX_4$ hydrolyzed in-situ during coating and bake steps as detailed in the following examples, a dose reduction of >30% with equivalent or lower LWR is observed relative to photoresist films derived from a mixture of pre-hydrolyzed organotin oxide hydroxide compounds (prepared as described in the '839 application) when processed under similar conditions.

Based on the improved process described in the Examples below, the improved properties of the coating material can be correspondingly characterized. For example, a substrate comprising an inorganic semiconductor layer and a radiation sensitive coating material along a surface can be subjected to patterning with EUV light at a wavelength of 13.5 nm in a pattern of 16-nm lines on a 32-nm pitch. To evaluate the coating material the dose to achieve a critical dimension of 16 nm can be evaluated along with the achievable line width roughness (LWR). The improved coatings can achieve a critical dimension of 16 nm with a dose from about 8 mJ/cm2 to about 25 mJ/cm2 with a line width roughness of no more than about 4 nm. SuMMIT analysis software (EUV Technology Corporation) was used to extract resist critical dimension (CD) and line-width-roughness (LWR) from SEM images.

In further embodiments, the improved patterning capability can be expressed in terms of the dose-to-gel value. A structure comprising a substrate and a radiation sensitive coating comprising an alkyl metal oxide hydroxide can have a dose-to-gel ($D_g$) of no more than about 6.125 mJ/cm$^2$ and in further embodiments from about 5.5 mJ/cm$^2$ to about 6 mJ/cm$^2$. Evaluation of dose-to-gel is explained in the Examples below.

REFERENCES (INCORPORATED HEREIN BY REFERENCE)

1) Maeng, W. J.; Pak, S. J.; Kim, H. *J. Vac. Sci. Tech B.* 2006, 24, 2276.
2) Rodríguez-Reyes, J. C. F.; Teplyakov, A. V. *J. Appl. Phys.* 2008, 104, 084907.
3) Leskelä, M.; Ritala, M. *Thin Solid Films* 2002, 409, 138.
4) Leskelä, M.; Ritala, M. *J. Phys. IV* 1999, 9, Pr8-852.
5) Atagi, L. M.; Hoffman, D. M.; Liu, J. R.; Zheng, Z.; Chu, W. K.; Rubiano, R. R.; Springer, R. W.; Smith, D. C. *Chem. Mater.* 1994, 6, 360.

EXAMPLES

Example 1—Preparation of Precursors for In Situ Hydrolysis

This example is directed to the formation of organotin amido compounds that are suitable for in situ hydrolysis to form coatings of organotin oxide hydroxides.

The precursor, tert-butyl tris(diethylamido)tin, (tBuSn(NEt$_2$)$_3$, hereinafter P-1) was synthesized after the method reported in Hanssgen, D.; Puff, H.; Beckerman, N. *J. Organomet. Chem.* 1985, 293, 191, incorporated herein by reference. Tetrakis(diethylamido)tin and tBuLi reagents were purchased from Sigma-Aldrich and used without further purification. Reagents were reacted in stoichiometric quantities at −78° C. in anhydrous hexanes (Sigma-Aldrich). Precipitated lithium amide salts were removed via filtration and the product rinsed with hexanes, and the solvent stripped under vacuum. The crude product was distilled under vacuum (~0.3 torr at 95° C.).

A solution was prepared in an Ar-filled glove box by weighing 1.177 g (3.0 mmol) of P-1 in a 30-mL amber glass vial and then adding 15 mL of anhydrous 4-methyl-2-pentanol (dried 24 h over 3 A molecular sieves). The vial was capped and agitated. This stock solution was diluted 1 part in 2.85 parts (volume) anhydrous 4-methyl-2-pentanol prior to coating.

The precursor, isopropyl tris(dimethylamido)tin, (iPrSn(NMe$_2$)$_3$, hereinafter P-2) was synthesized under inert atmosphere and subsequently dissolved in toluene to form a resist precursor solution. Under argon, a 1-L Schlenk-adapted round bottom flask was charged with LiNMe$_2$ (81.75 g, 1.6 mol, Sigma-Aldrich) and anhydrous hexanes (700 mL, Sigma-Aldrich) to form a slurry. A large stir bar was added and the vessel sealed. An addition funnel under positive argon pressure was charged with iPrSnCl$_3$ (134.3 g, 0.5 mol, Gelest) via syringe and then attached to the reaction flask. The reaction flask was cooled to −78° C. and the iPrSnCl$_3$ was then added dropwise over a period of 2 hours. The reaction was warmed to room temperature overnight while stirring. The reaction produces a by-product solid. After settling, the solid was filtered under positive argon pressure through an in-line cannula filter. The solvent was then removed under vacuum, and the residue distilled under reduced pressure (50-52° C., 1.4 mmHg) to give a pale yellow liquid (110 g, 75% yield). $^1$H and $^{119}$Sn NMR spectra of the distillate in a C$_6$D$_6$ solvent were collected on a Bruker DPX-400 (400 MHz, BBO probe) spectrometer. Observed $^1$H resonances (s, 2.82 ppm, —N(CH$_3$)$_2$; d 1.26 ppm, —CH$_3$; m, 1.60 ppm, —CH) match the predicted spectrum for iPrSn(NMe$_2$)$_3$. The primary $^{119}$Sn resonance at −65.4 ppm is consistent with a major product having a single tin environment; the chemical shift is comparable to reported monoalkyl tris(dialkylamido)tin compounds.

A solution was prepared in an Ar-filled glove box by weighing 0.662 g (2.25 mmol) of P-2 in a 30 mL amber glass vial. A 15-mL volume of anhydrous toluene (dried 24 h over 3 A molecular sieves) were then added to make a stock solution (SOL-2). The vial was then capped and agitated. This stock solution was diluted 1 part in 3 parts (volume) anhydrous toluene prior to coating.

Example 2—Patterning of In Situ Hydrolysed Photoresist Coatings

This example demonstrates the successful in situ hydrolysis of coatings formed from the compositions of Example 1 and the subsequent EUV patterning.

Thin films were deposited on silicon wafers (100-mm diameter) with a native-oxide surface. The Si wafers were treated with a hexamethyldisilazane (HMDS) vapor prime prior to deposition of the amido precursor. Solutions of P-1 in 4-methyl-2-pentanol were spin-coated on substrates in air at 1500 rpm and baked on a hotplate in air for 2 min at 100° C. to evaporate residual solvent and volatile hydrolysis products. Film thickness following coating and baking was measured via ellipsometry to be ~31 nm.

Figure 7:
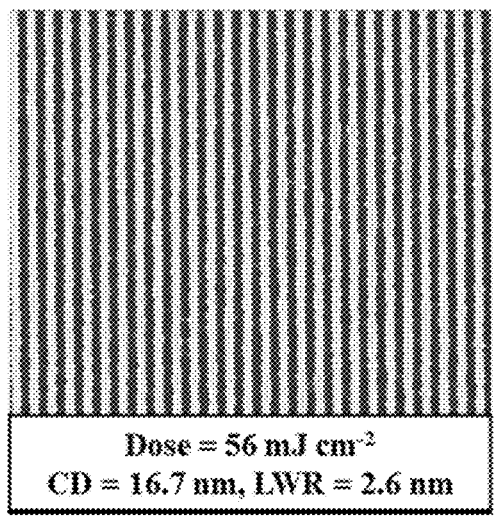
FIG. 7 is a scanning electron (SEM) micrograph of a regular pattern formed on substrate with a line spacing of 16.7 nm formed with an EUV dose of 56 mJ/cm$^2$.

The coated substrates were exposed to extreme ultraviolet radiation (Lawrence Berkeley National Laboratory Micro Exposure Tool). A pattern of 17-nm lines on a 34-nm pitch was projected onto the wafer using 13.5-nm wavelength radiation, dipole illumination, and a numerical aperture of 0.3. The patterned resists and substrates were then subjected to a post-exposure bake (PEB) on a hotplate for 2 min at 170° C. in air. The exposed film was then dipped in 2-heptanone for 15 seconds, then rinsed an additional 15 seconds with the same developer to form a negative tone image, i.e., unexposed portions of the coating were removed. A final 5-min hotplate bake at 150° C. in air was performed after development. FIG. 7 exhibits an SEM image of 16.7-nm resist lines produced from P-1 cast from 4-methyl-2-pentanol on a 34-nm pitch at a EUV dose of 56 mJ/cm$^2$ with a calculated LWR of 2.6 nm.

Figure 8:
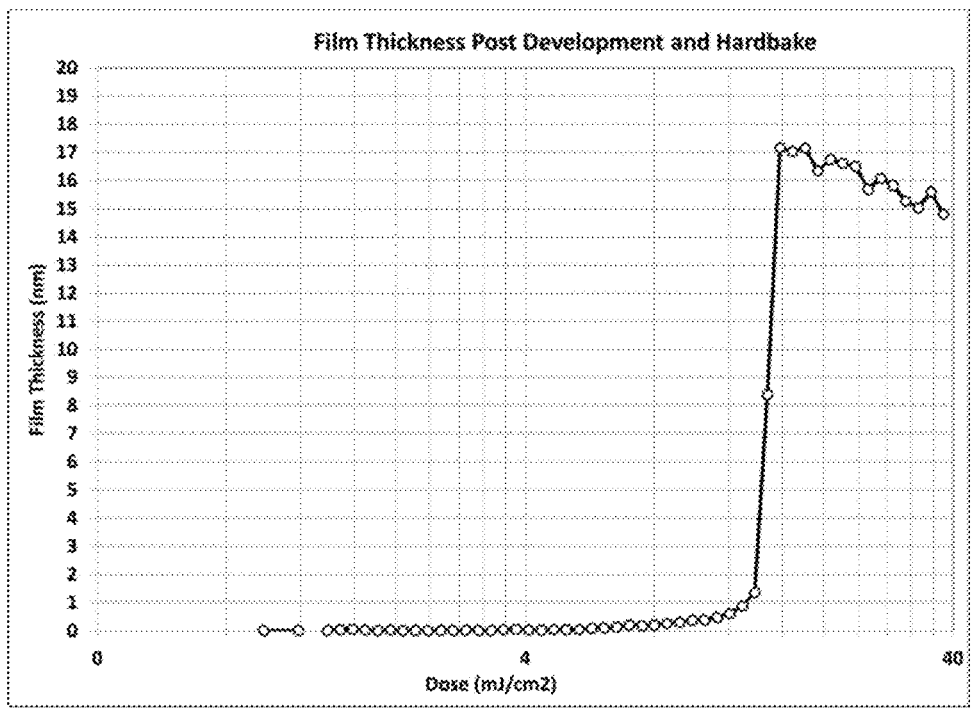
FIG. 8 is a plot of film thickness following exposure and development as a function of EUV dose formed for 50 circular pads 500 microns in diameter exposed with stepped doses for substrates coated with radiation resists as described herein with in situ hydrolysis.
Figure 9:
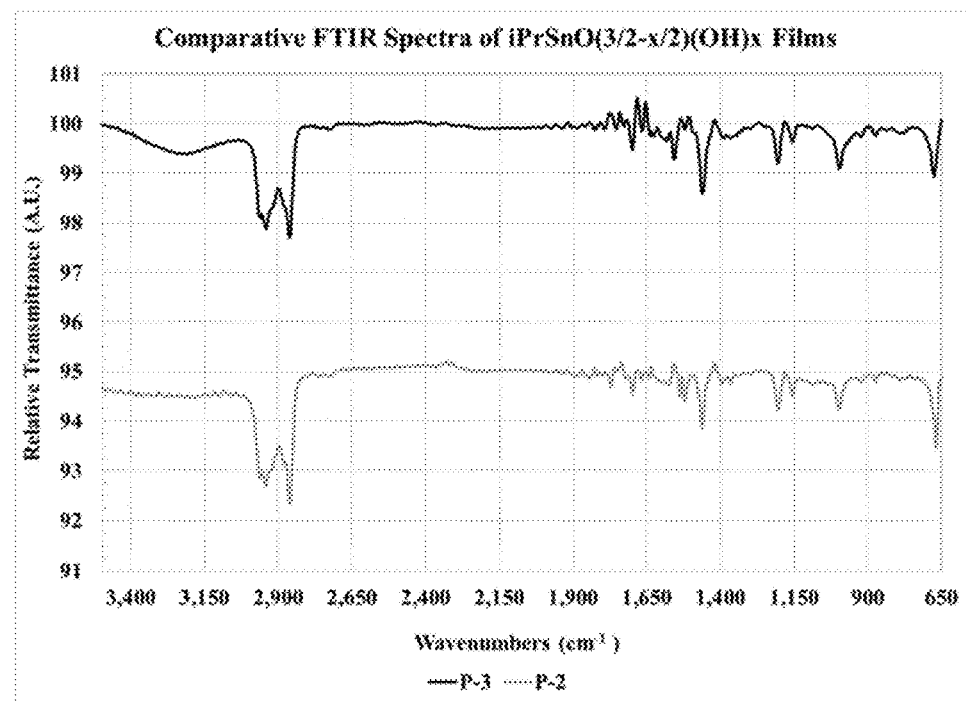
FIG. 9 is a plot with two FTIR spectra comparing films formed with solution based hydrolysis versus in situ hydrolysis in the coating.

A second film was cast from the solution of P-2 in toluene using identical coating and bake conditions as above. A linear array of 50 circular pads ~500 um in diameter were projected on the wafer using EUV light. Pad exposure times were modulated to step the delivered EUV dose for each pad from 1.38 to 37.99 mJ cm$^{-2}$ with an exponential 7% step. Following the PEB, development, and final bake processes described above, a J. A. Woollam M-2000 Spectroscopic ellipsometer was used to measure the residual thickness of the exposed pads. The thickness of each pad is plotted as a function of delivered EUV dose in FIG. 8. The resulting curve clearly illustrates the negative tone contrast generated on exposure, as residual film thickness starts at ~0 and reaches a maximum (dose to gel, $D_g$) at approximately 15.8 mJ cm$^{-2}$ delivered dose.

Example 3—Evaluation of In Situ Hydrolyzed Coatings

This example provides evidence of the substantially complete hydrolysis through the in situ hydrolysis approach for precursors having hydrolysable bonds to Sn.

For comparison, isopropyl tin oxide hydroxide was prepared for formation of a radiation sensitive coating. A solid hydrolysate of isopropyltin trichloride (iPrSnCl$_3$, Gelest) was prepared by rapidly adding 6.5 g (24 mmol) of isopropyltin trichloride to 150 mL of 0.5-M NaOH (aq) with vigorous stirring, immediately producing a precipitate. The resulting mixture was stirred for 1 h at room temperature and then filtered with suction through no. 1 filter paper (Whatman). The retained solids were washed three times with ~25-mL portions of DI H$_2$O and then dried for 12 h under vacuum (~5 torr) at room temperature. Elemental analyses (18.04% C, 3.76% H, 1.38% Cl; Microanalysis, Inc.; Wilmington, Del.) of the dried powder, indicated substantial removal of chloride ions upon hydrolysis of isopropyltin trichloride and an approximate hydrolysate empirical formula of $^i$PrSnO$_{(3/2-(x/2))}$(OH)$_x$ where x≈1 (hereinafter P-3). (Calculated for C$_3$H$_8$O$_2$Sn: 18.50% C, 4.14% H, 0.00% Cl).

A solution of the solid hydrolysate iPrSnO$_{(3/2-(x/2))}$(OH)$_x$ was prepared by dissolving the dried powder in 2-butanone to a total Sn concentration of ~0.25 M. A solution of P-2 in anhydrous 4-methyl-2-pentanol was prepared by adding 1.47 g (5.0 mmol) P-2 to 10 mL 4-methyl-2-pentanol as previously described. Thin films were cast by spin coating each solution on a 25 mm×25 mm Si wafer. The solution of P-2 was coated at 2000 rpm, while the solution of P-3 was coated at 1250 rpm. Following coating, each film was baked at 150° C. in air for 2 minutes. The alcohol may react with P-2 to form alkoxide ligands, but in any case, if alkoxide ligands form, these seem to be further hydrolysed to form the oxide hydroxide composition.

Fourier Transform Infrared (FTIR) transmission spectra of the two films were collected on a Nicolet 6700 spectrometer using a bare substrate as a background. Representative spectra for the two films (FIG. 8) are qualitatively very similar, suggesting substantial hydrolysis and elimination of amido/alkoxo ligands from the solution of P-2 and deposition of the oxide hydroxide in both cases. In particular, the regions from 2800-3000 cm$^{-1}$ and 1100-1500 cm$^{-1}$ are almost identical, indicating a similar CH$_x$ composition between the two films, as well as the absence of substantial C—N species.

Example 4—Preparation of Hydrolysable Precursors with Tetrakis-Dialkylamido or -Tert-Butoxo Tin Compounds This example describes formation of mixed hydrolysable precursor compounds to provide for control of the stoichiometry of radiation sensitive ligands relative to metal in the radiation sensitive coatings.

Tert-butyl tris(diethylamido)tin was synthesized as described in Example 1. Tetrakis(dimethylamido)tin, (Sn(NMe$_2$)$_4$, FW=295.01) was purchased from Sigma-Aldrich and used without further purification.

Tin (IV) tert-butoxide, (Sn(O$^t$Bu)$_4$, FW=411.16, hereinafter P-5) was prepared after the method of Hampden-Smith et al. *Canadian Journal of Chemistry*, 1991, 69, 121, incorporated herein by reference: Stannous chloride (152 g/0.8 mol) and pentane (1 L) were added to a 3-L oven-dried round-bottom flask equipped with a magnetic stir-bar and purged with nitrogen. A 1-L pressure-equalizing addition funnel fitted with a nitrogen pressure inlet was charged with diethylamine (402 mL/3.9 mol) and pentane (600 mL) and then attached to the flask, and the flask submerged in an ice bath. The amine solution was then added dropwise such that a gentle reflux was maintained. Upon completion of the amine addition, 2-methyl-2-propanol (290 g/3.9 mol) in pentane (50 mL) was added to the addition funnel and thence dropwise to the flask. After stirring for 18 hours, the slurry was transferred into an air-free fritted filter flask and precipitated salts removed. The solvent was removed under reduced pressure and the target compound distilled (B.P.=60-62 C @ 1 torr). $^1$H NMR (C$_6$D$_6$): 1.45 ppm (s); $^{119}$Sn NMR (C$_6$D$_6$): −371.4 ppm (s).

Stock solutions of P-1 ($^t$BuSn(NEt$_2$)$_3$, hereinafter S-1), P-4 (Sn(NMe$_2$)$_4$, hereinafter S-2), and P-5 (Sn(O$^t$Bu)$_4$, hereinafter S-3) were prepared by transferring each of the corresponding compounds via cannula into separate flasks containing anhydrous 4-methyl-2-pentanol (dried 24 h over 4 A molecular sieves). Additional dry 4-methyl-2-pentanol was then added to dilute the solutions to 0.25 M (Sn) final concentration.

A further stock solution, S-4, was prepared by cannulating 41 g of P-1 into a round bottom flask immersed in an iso-propanol/dry ice bath and containing 250 mL of methanol while stirring on a magnetic stir plate. After the transfer of the $^t$BuSn(NEt$_2$)$_3$ aliquot, the flask containing the mixture was removed from the ice bath and allowed to reach room temperature. Next, the flask containing the mixture was brought to 50° C. in a water bath attached to a rotary evaporator and the solvent stripped at reduced pressure (10 torr) until solvent evaporation was substantially complete and a viscous yellow oil obtained. Finally, the yellow oil was dissolved in 1.0 L of 4-methy-2-pentanol. The resulting solution was determined to have a molarity of 0.097 M [Sn] based on the residual mass of the solution following solvent evaporation and subsequent thermal decomposition of the residual solids to SnO$_2$.

Precursor coating solutions CS-a, CS-b, and CS-c were prepared by mixing stock solution S-1 with S-2 in 0, 5:1, and 9:1 volume ratios to produce coating solutions where 0 (a), 10 (b), and 20 (c) mol % of the total Sn concentration in the mixture was derived from Sn(NMe$_2$)$_4$. These solutions were then further diluted with 4-methyl-2-pentanol to 0.070 M (total Sn) prior to spin coating. For example, to prepare 200 mL of CS-b, 5.6 mL of the stock solution prepared from Sn(NMe$_2$)$_4$ (S-2) was added to 50.4 mL of the solution prepared from $^t$BuSn(NEt$_2$)$_3$ (S-1), mixed vigorously, and diluted to 200 mL total volume with dry 4-methyl-2-pentanol. A summary of precursor coating solutions, concentrations, and compositions is presented in Table 2.

Precursor coating solutions CS-e-h were prepared with a total Sn concentration of 0.044 M by mixing stock solution S-4 with stock solutions S-2 and S-3 in appropriate volume ratios such that 10 and 20 mol % of the total Sn concentration was derived from Sn(NMe$_2$)$_4$ (CS-e, CS-f, respectively), and Sn(O$^t$Bu)$_4$ (CS-g, CS-h) and diluting with dry 4-methyl-2-pentanol. Precursor coating solution CS-d was prepared by directly diluting stock solution S-4 with dry 4-methyl-2-pentanol to a final concentration of 0.042 M Sn. As an example, 200 mL of precursor coating solution CS-e is prepared by mixing 72.6 mL of S-4 with 7.04 mL of S-3, and diluting to 200 mL total volume with dry 4-methyl-2-pentanol.

TABLE 2

| Precursor Coating Solution | $^t$Bu—Sn Stock Solution | Total Conc. [Sn] (M) | mol % Sn from Sn(NMe)$_4$ | mol % Sn from Sn(O$^t$Bu)$_4$ |
|---|---|---|---|---|
| a | 1 | 0.070 | 0 | 0 |
| b | 1 | 0.070 | 10 | 0 |
| c | 1 | 0.070 | 20 | 0 |
| d | 4 | 0.042 | 0 | 0 |
| e | 4 | 0.044 | 10 | 0 |
| f | 4 | 0.044 | 20 | 0 |
| g | 4 | 0.044 | 0 | 10 |
| h | 4 | 0.044 | 0 | 20 |

Precursor coating solution CS-i was prepared by mixing a methanol solution containing a pre-hydrolysed t-butyl tin oxide hydroxide hydrolysate with a 4-methyl-2-pentanol solution of a prehydrolysed i-propyl tin oxide hydroxide hydrolysate, and diluting the resulting mixture to 0.03 M [Sn] with pure solvents as described in the '839 application. The resulting solutions are characterized as a blend of $^i$PrSnO$_{(3/2-(x/2))}$(OH)$_x$ and $^t$BuSnO$_{(3/2-(x/2))}$(OH)$_x$ hydrolysates, where the fraction of t-BuSnO$_{(3/2-(x/2))}$(OH)$_x$ is 40% relative to the total moles of Sn.

Example 5—Patterning with Engineered Coatings with Selected Degree of Radiation Sensitive Ligands This example presents results obtain by patterning of coatings formed with the coating solutions prepared as described in Example 4 demonstrating improved patterning with lower radiation doses.

Tert-butyltin oxide hydroxide photoresist films were deposited from precursor coating solutions from Example 4 prepared from $^t$BuSn(NEt$_2$)$_3$ and, for some coating solutions, Sn(NMe$_2$)$_4$ or Sn(O$^t$Bu)$_4$, and then exposed with EUV radiation. Thin films for EUV contrast curves were deposited on silicon wafers (100-mm diameter) with a native-oxide surface. The Si wafers were treated with a hexamethyldisilazane (HMDS) vapor prime prior to deposition. Precursor coating solutions CS-a, CS-b, and CS-c (0.070 M Sn) prepared according to specification in Table 1 from $^t$BuSn(NEt$_2$)$_3$ and 0, 10, and 20 mol % Sn(NMe$_2$)$_4$ were spin-coated the Si substrates in air at 1500 rpm and baked on a hotplate in air for 2 min at 100° C. to eliminate residual solvent and volatile hydrolysis products. Film thicknesses following coating and baking were measured via ellipsometry to be ~25-28 nm.

Figure 10:
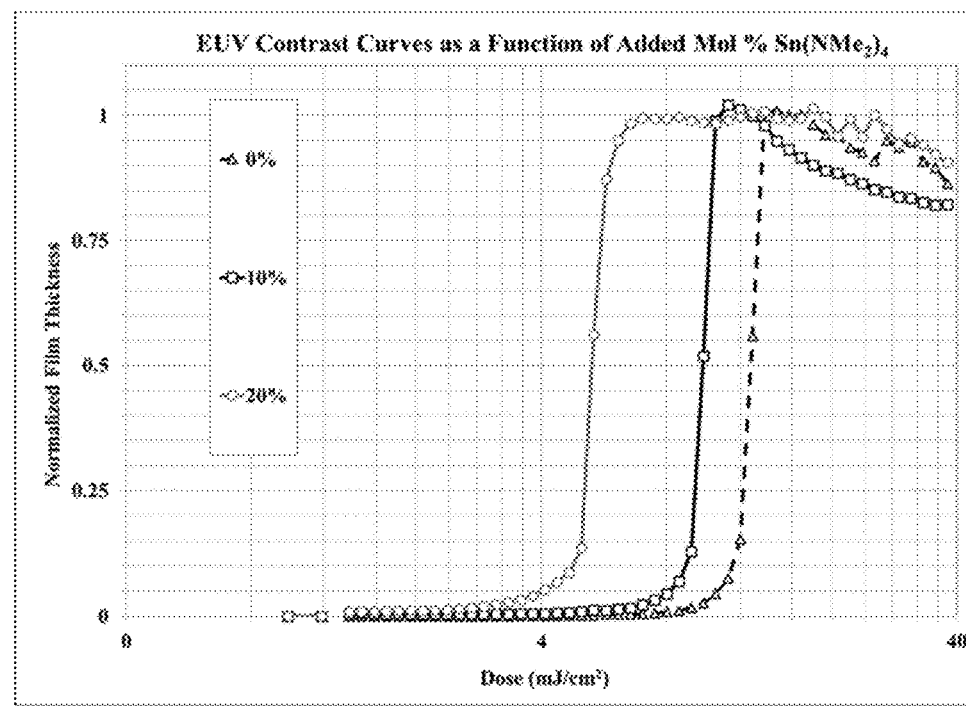
FIG. 10 is a set of plots with EUV contrast curves involving a function of dose for coatings formed with three different amounts of $Sn(NMe_2)_4$ in the radiation sensitive coating prior to in situ hydrolysis.

A linear array of 50 circular pads ~500 μm in diameter were exposed on each wafer with EUV light using the Lawrence Berkeley National Laboratory Micro Exposure Tool. Pad exposure times were modulated to step the delivered EUV dose for each pad from 1.38 to 37.99 mJ cm$^{-2}$ with an exponential 7% step. After exposure, wafers were subjected to a post-exposure bake (PEB) on a hotplate in air at 170° C. for 2 min. The exposed film was then dipped in 2-heptanone for 15 seconds and rinsed an additional 15 seconds with the same developer to form a negative tone image, i.e., unexposed portions of the coating were removed. A final 5-min hotplate bake at 150° C. in air was performed after development. A J. A. Woollam M-2000 spectroscopic ellipsometer was used to measure the residual thickness of the exposed pads. The measured thicknesses were normalized to the maximum measured resist thickness and plotted versus the logarithm of exposure dose to form characteristic curves for each resist at a series of post exposure bake temperatures. See FIG. 10. The maximum slope of the normalized thickness vs log dose curve is defined as the photoresist contrast ($\gamma$) and the dose value at which a tangent line drawn through this point equals 1 is defined as the photoresist dose-to-gel, ($D_g$). In this way common parameters used for photoresist characterization may be approximated following Mack, C. *Fundamental Principles of Optical Lithography*, John Wiley & Sons, Chichester, U.K; pp 271-272, 2007.

The resulting curves clearly illustrate the negative-tone contrast generated on exposure, as residual pad thickness for each resist film starts at ~0 and reaches a maximum near $D_g$. The dose required to initiate the development rate change is clearly observed to decrease as the mol fraction of Sn in the precursor coating solutions corresponding to $Sn(NMe_2)_4$ is increased from 0 ($D_g$=13.8 mJ cm$^{-2}$), to 10% ($D_g$=10.6 mJ cm$^{-2}$), and finally 20% ($D_g$=5.8 mJ cm$^{-2}$).

High-resolution line-space patterns were likewise printed using a EUV scanner and tert-butyltin oxide hydroxide photoresist films cast from precursor coating solutions CS-d, CS-e, and CS-f. Silicon wafers (300-mm diameter) with a native-oxide surface were used as substrates without additional surface treatment. Precursor coating solutions CS-d-h prepared from $^t$BuSn(NEt$_2$)$_3$ and 0, 10, or 20 mol % Sn(NMe$_2$)$_4$ or Sn(O$^t$Bu)$_4$ as described above, as well as CS-i, were spin-coated on the Si substrates in air at 1000 or 1500 rpm (CS-d only) and baked on a hotplate in air for 2 min at 100° C.

Figure 11:
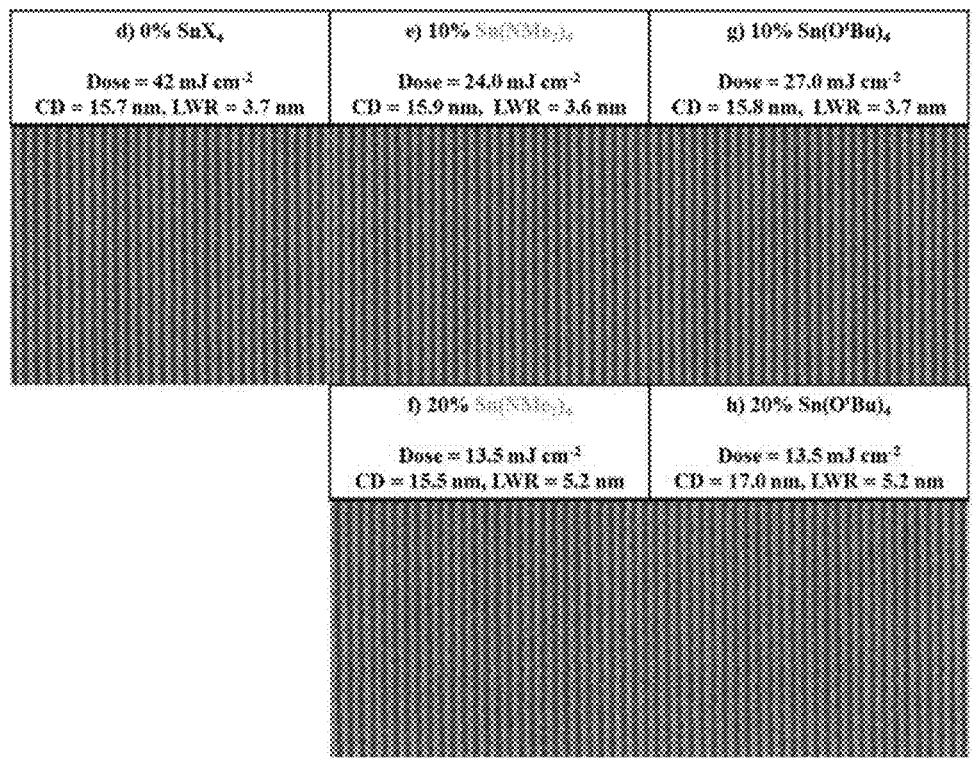
FIG. 11 is a set of SEM micrographs for five patterned coatings formed with indicated compositions and irradiation doses.
Figure 12:
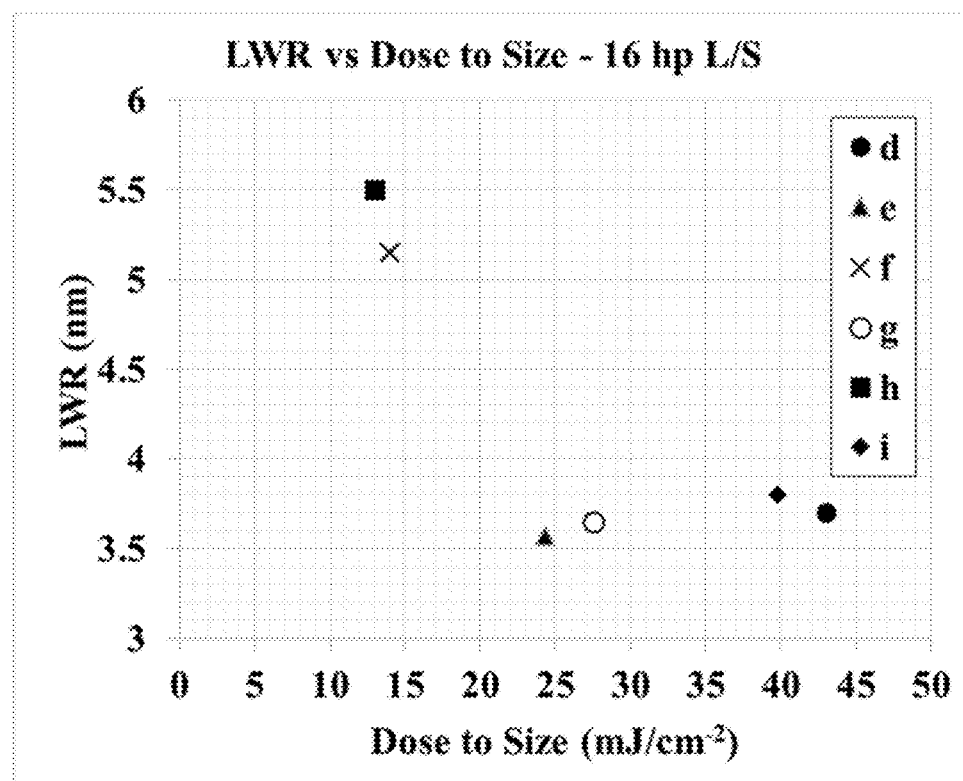
FIG. 12 is a plot of line width roughness (LWR) as a function of dose-to-size for 6 resist compositions based on patterned with EUV light at a wavelength of 13.5 nm in a pattern of 16-nm lines on a 32-nm pitch with the dose-to-size value to achieve a critical dimension of 16 nm.

The coated substrates were exposed to extreme ultraviolet radiation using a NXE:3300B EUV scanner with dipole 60× illumination and a numerical aperture of 0.33. A pattern of 16-nm lines on a 32-nm pitch was projected on the coated wafer following 2 minute, 100° C. post-apply bake (PAB). The exposed resist films and substrates were then subjected to a PEB on a hotplate for 2 min at 170° C. in air. The exposed films were then developed in 2-heptanone for 15 seconds, then rinsed an additional 15 seconds with the same developer to form a negative tone image, i.e., unexposed portions of the coating were removed. A final 5-min hotplate bake at 150° C. in air was performed after development. FIG. 11 exhibits SEM images of the resulting resist lines developed from tert-butyltin oxide hydroxide photoresist films. The imaging dose, critical dimension, and line-width roughness are shown for each film cast from precursor coating solutions prepared from $^t$BuSn(NEt$_2$)$_3$ (CS-d), and 10 or 20 mol % Sn(NMe$_2$)$_4$ (CS-e, CS-f, respectively), or Sn(O$^t$Bu)$_4$ (CS-g, CS-h). Again, imaging dose is observed to decrease with increasing fraction of SnX$_4$ added to the precursor coating solution. The imaging dose required to achieve a critical dimension of 16 nm is plotted versus the calculated LWR each film cast from precursor coating solutions d-i is plotted in FIG. 12. Significantly, a >30% reduction in the required imaging dose in is obtained for the films cast from CS-e and -f, relative to -i without a concomitant increase in line-width-roughness (LWR), indicating a substantial improvement over the pre-hydrolysed mixed alkyl ligand formulation and an important circumvention (over that dose range) of the commonly observed inverse relationship between patterning dose and LWR.

Example 6

Pattering performance is evaluated for coatings prepared with a mixture of tert-butyl and methyl radiation sensitive ligands.

Specifically, precursor solution preparation, film coating, and lithographic performance were examined in the context of organotin oxide hydroxide photoresist films comprising a mixture of $^t$BuSnO$_{(3/2-(x/2))}$(OH)$_x$ and MeSnO$_{(3/2-(x/2))}$(OH)$_x$ prepared via in situ hydrolysis of a precursor solution comprising $^t$BuSnX$_3$ and MeSnX$_3$ compounds.

MeSn(O$^t$Bu)$_3$ (FW=353.1, hereinafter P-6) was synthesized as follows from MeSnCl$_3$ (Gelest), an oven-dried RBF equipped with an addition funnel and magnetic stir-bar was charged with 0.8 M MeSnCl$_3$ in pentane. While cooling with an ice bath, 4 molar equivalents of diethylamine in pentane (5.5 M) were added dropwise through the addition funnel. Upon complete addition, 4 molar equivalents of tert-butyl alcohol mixed 3.25:1 (vol) in pentane were added, and the solution is allowed to stir at room temperature for 30 min. The reaction mixture was then filtered and volatiles removed under vacuum leaving a product as a light oil. The product was then distilled at 55-60° C. at ~0.1 torr.

A stock solution of P-6 was prepared by dissolution in dry 4-methyl-2-pentanol. This solution of MeSn(O$^t$Bu)$_3$ was mixed at various volume ratios with a second stock solution of prepared from $^t$BuSn(NEt$_2$)$_3$ in 4-methyl-2-pentanol in an identical manner to solution S-4 above and diluted with the same solvent to achieve a total Sn concentration of 0.05 M. By this method a series of precursor solutions were prepared with a range of 0-60 mol % of the total alkyl-Sn concentration added as MeSn(OtBu)$_3$. These precursor solutions were coated on 100-mm Si substrates, baked at 100° C., and then exposed to EUV radiation at varying doses creating a contrast array as previously described.

Figure 13:
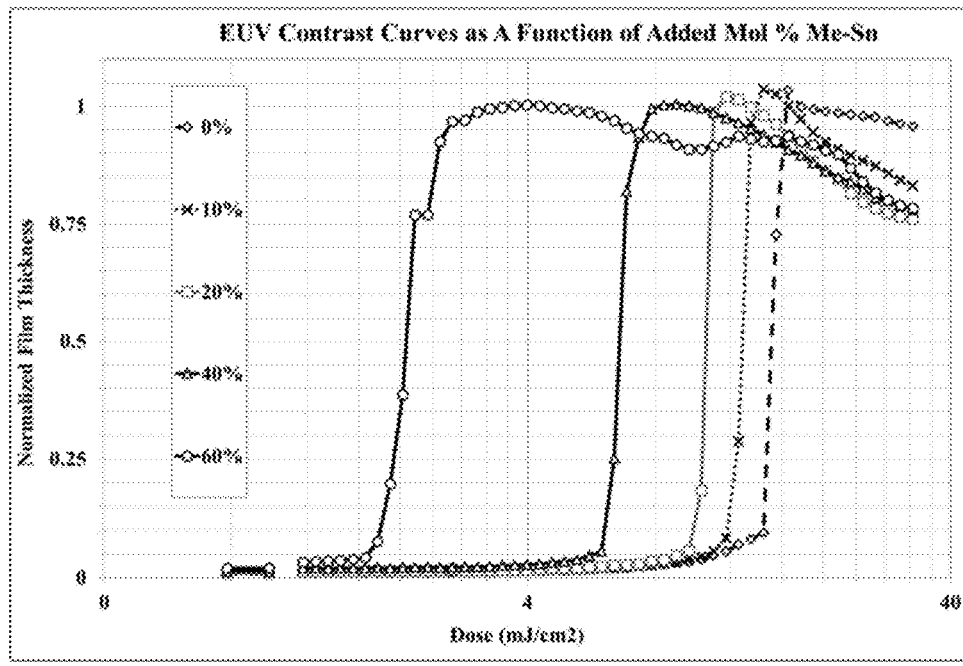
FIG. 13 is a set of plot of EUV contrast curves involving a function of dose for 5 coatings formed with varying amounts of methyl ligands as a radiation sensitive group.

Following exposure the coated wafers were baked at 170° C. in air and developed for 15 s in 2-heptanone, rinsed for 15 s with a wash-bottle containing the same solvent, then dried under N$_2$ and baked in air at 150° C. for 5 min. The residual thickness of each exposure pad was measured and plotted as a function of dose in FIG. 13. Extracted resist metrics (see Example 5) are tabulated in Table 3. It is observed from FIG. 13 that Dg decreases markedly as the mol % of MeSn(OtBu)$_3$ in the precursor solution increases, while the contrast remains high, even at relatively low values of $D_g$. Importantly, the residual thickness <<$D_g$ is consistently near zero, indicating the resist is cleared in the unexposed region with minimal residue (scum).

TABLE 3

| Mol % MeSn(OtBu)$_3$ | $D_g$ (mJ/cm$^2$) | $\gamma$ Contrast |
|---|---|---|
| 0 | 16.1 | 15.8 |
| 10 | 14.1 | 14.8 |
| 20 | 11.6 | 15.6 |
| 40 | 7.3 | 12.7 |
| 60 | 2.3 | 9.4 |

Figure 14:
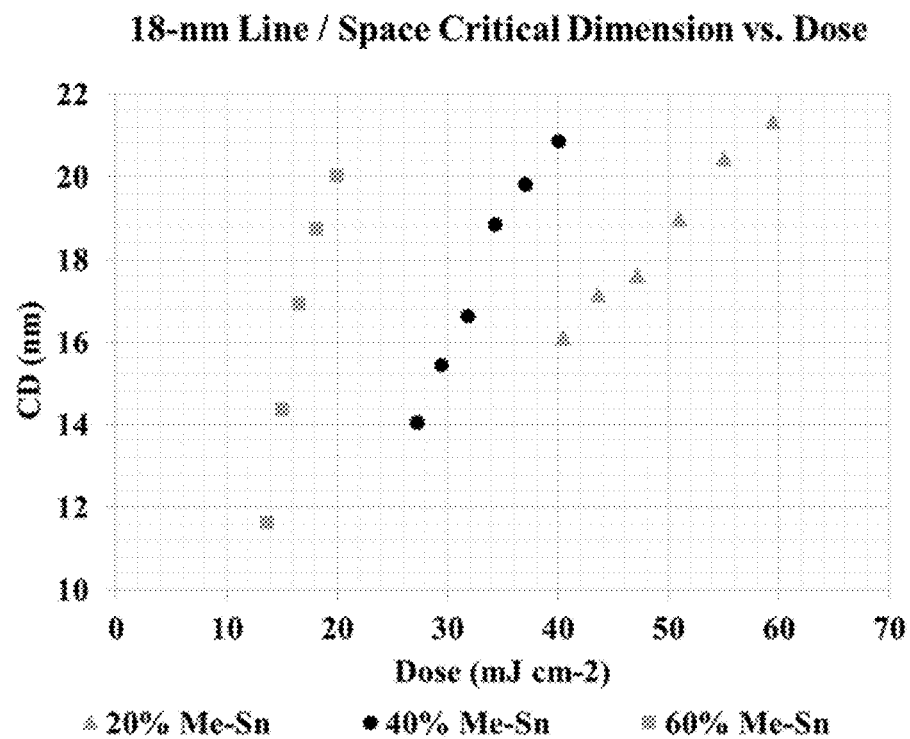
FIG. 14 is a set of plots of space critical dimensions as a function of irradiation dose for coatings with three different amounts of methyl ligands.
Figure 15:
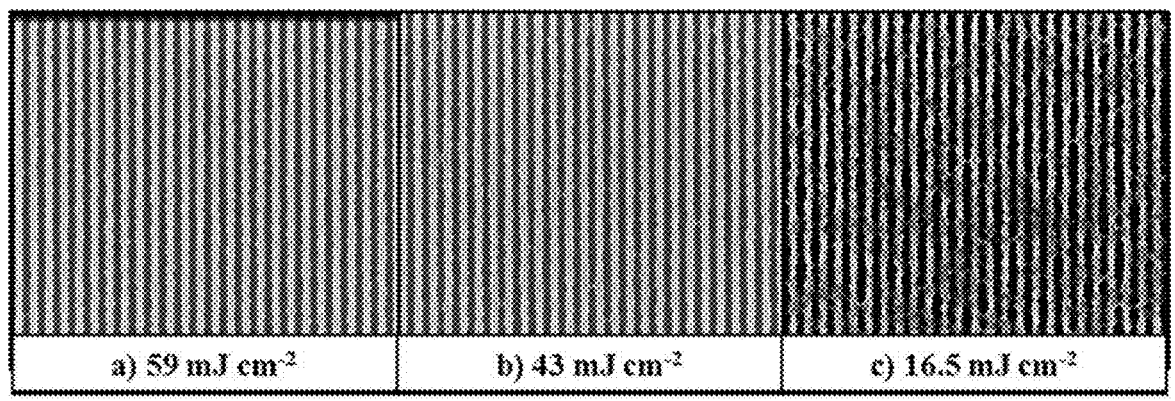
FIG. 15 is set of three SEM micrographs for patterns formed with differing EUV radiation doses.

A pattern of 18-nm lines on a 36-nm pitch was exposed on similarly processed wafers, using the Lawrence Berkeley National Laboratory Micro Exposure Tool using 13.5-nm wavelength radiation, dipole illumination, and a numerical aperture of 0.3. The line width (CD) measured with a SEM and plotted versus imaging dose in FIG. 14. Again the imaging dose required to achieve a given line-width is found to strongly decrease as the mol-fraction of MeSn(O$^t$Bu)$_3$ in the precursor solution is increased. Representative SEM images from the same wafers are shown in Figure FIG. 15 for precursor solutions containing a) 20%, b) 40%, and c) 60% P-6.

The embodiments above are intended to be illustrative and not limiting. Additional embodiments are within the claims and additional inventive concepts. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

Additional Inventive Concepts

1. A method for forming a radiation patternable coating comprising an oxo-hydroxo network with metal cations having organic ligands with metal carbon bonds and metal oxygen bonds, the method comprising:

inputting into a deposition chamber closed from the ambient atmosphere a first precursor vapor comprising a composition represented by the formula $R_nSnX_{4-n}$ where n=1 or 2, wherein R is an organic ligand with 1-31 carbon atoms bound to Sn with a metal-carbon bond, n=1 or 2, and X is a ligand having a hydrolysable bond with Sn and inputting sequentially or at the same time a second precursor vapor comprising an oxygen-containing compound capable of reacting with the composition in the first precursor vapor under conditions in the deposition chamber to form a composition with non-volatile components and a volatile component comprising a reaction product with X ligand or ligands, wherein a substrate is configured with a surface to receive the non-volatile components of the composition.

2. The method of additional inventive concept 1 wherein the second precursor vapor comprises water vapor.

3. The method of additional inventive concept 1 wherein the deposition chamber has a pressure from about 0.01 Torr to about 25 Torr.

4. The method of additional inventive concept 1 wherein the deposition chamber has a temperature from about 40° C. to about 175° C.

5. The method of additional inventive concept 1 further including a step of inputting an inert purge gas between each cycle of inputting precursor vapors.

6. The method of additional inventive concept 1 where a third precursor is separately inputted to the chamber the precursor comprising $ML_v$, where v is $2 \le v \le 6$ and L is an oxidixable ligand or a ligand having a hydrolysable M-L bond or a combination thereof, and M is a metal selected from groups 2-16 of the periodic table.

7. A coated substrate comprising a substrate with a surface and a coating on the surface comprising:

an organometallic composition represented by the formula y $(R_zSnO_{(2-(z/2)-(w/2))}(OH)_w) \cdot z\ MO_{((m/2)-1/2)}(OH)_1$ where R is a hydrocarbyl group with 1-31 carbon atoms or a combination thereof, $0<z\le2$, $0<(z+w)\le4$, m=formal valence of $M^{m+}$ $0\le m$, y/z=(0.05 to 0.6), and M=M' or Sn, where M' is a non-tin metal of groups 2-16 of the periodic table.

8. A structure comprising a substrate and a radiation sensitive coating comprising an alkyl metal oxide hydroxide having a dose-to-gel ($D_g$) of no more than about 6.125 mJ/cm².

9. A structure comprising a substrate comprising an inorganic semiconductor layer and a radiation sensitive coating material along a surface, wherein the radiation coating material can be patterned with EUV light at a wavelength of 13.5 nm in a pattern of 16-nm lines on a 32-nm pitch to achieve a critical dimension of 16 nm with a dose from about 8 mJ/cm2 to about 25 mJ/cm2 with a line width roughness of no more than about 4 nm.

10. The structure of additional inventive concept 9 wherein the radiation sensitive coating material has at least 5 weight percent of metal.

11. The structure of additional inventive concept 9 wherein the radiation sensitive coating material has at least 20 weight percent of metal.

What is claimed is:

1. A method for forming a radiation patternable coating, the method comprising:

exposing a precursor coating on a substrate to water, wherein the precursor coating comprises:

a first organometallic composition $R_zSnO_{(2-(z/2)-(x/2))}(OH)_x$ where $0<z\le2$ and $0<(z+x)\le4$, or $R'_nSnX_{4-n}$ where n=1 or 2 and R and R' are independently hydrocarbyl groups with 1-31 carbon atoms and X is a ligand with a hydrolysable Sn—X bond or combination thereof, or a mixture thereof; and a second organometallic composition $R''_ySnX'_{4-y}$ where y=1 or 2 and R" is different from R' and X' is a ligand with a hydrolysable Sn—X' bond or combination thereof that is the same or different from X, or an inorganic composition $ML_v$, where v is $2\le v \le 6$ and L is a ligand with a hydrolysable M-L bond or combination thereof that is the same or different from X and X', or a mixture thereof, wherein the exposing results in hydrolysis of the precursor coating to form a coating comprising ((R and/or R')$_a$R"$_b$)SnO$_{(2-((a+b)/2)-(w/2))}$(OH)$_w$, where $0<(a+b)\le2$ and $0<(a+b+w)<4$; or comprising y ((R or R')$_a$R"$_b$) SnO$_{(2-((a+b)/2)-(w/2))}$(OH)$_w \cdot z\ MO_{((m/2)-1/2)}$(OH)$_l$ where $0<(a+b)\le2$, $0<(a+b+w)<4$, m=formal valence of $M^{m+}$, $0\le l \le m$, y/z=(0.05 to 0.6), and M=M' or Sn, where M' is a non-tin metal of groups 2-16 of the periodic table.

2. The method of claim 1 wherein the exposing step comprises heating the substrate to a temperature from about 45° C. to about 250° C. for from about 0.5 minutes to about 30 minutes.

3. The method of claim 1 wherein the precursor coating is formed using a solution having from about 0.0025M to about 1.5M tin in organic solvent.

4. The method of claim 3 wherein the solution is spin coated to form the precursor coating.

5. The method of claim 1 wherein the first organometallic composition comprises $R'_nSnX_{4-n}$.

6. The method of claim 1 wherein the inorganic composition comprises $SnL_4$.

7. The method of claim 1 wherein R or R' is a methyl, ethyl, i-propyl, n-butyl, s-butyl or t-butyl group.

8. The method of claim 1 wherein X and X' are independently selected from the group consisting of alkylamido or dialkylamido (—NR$^1$R$^2$, where R$^1$ and R$^2$ are independently hydrocarbon groups with 1-10 carbon atoms or hydrogen), siloxo (—OSiR$^1$R$^2$ where R$^1$, R$^{2'}$ are R$^3$, independently hydrocarbon groups with 1-10 carbon atoms), silylamido (~N(SiR$^1_3$)(R$^2$), where R$^1$ and R$^2$ are independently hydrocarbon groups with 1-10 carbon atoms), disilylamido (—N(SiR$^1_3$)(SiR$^2_3$) where R$^1$ and R$^2$ are independently hydrocarbon groups with 1-10 carbon atoms), alkoxo and aryloxo (—OR, where R is an alkyl or aryl group with 1-10 carbon atoms), azido (~N$_3$), alkynido (—C≡CR, where R is a hydrocarbon group with 1-9 carbon atoms), amidato (—NR$^1$(COR$^2$) where R$^1$ and R$^2$ are independently hydrocarbon groups with 1-7 carbon atoms or hydrogen), amidinato (~NR$^1$C(NR$^2$)R$^3$) where R$^1$ and R$^2$ are independently hydrocarbon groups with 1-8 carbon atoms or hydrogen), imido (—N(COR$^1$)(COR$^2$), where R$^1$ and R$^2$ are independently hydrocarbon groups with 1-8 carbon atoms or hydrogen), or fluorinated analogues thereof, or combinations thereof.

9. The method of claim 1 wherein the water is ambient atmospheric water.

10. The method of claim 1 wherein after the exposing step, the radiation patternable coating is irradiated with a pattern of EUV radiation.

* * * * *